(12) United States Patent
Gonzalez et al.

(10) Patent No.: US 9,991,412 B2
(45) Date of Patent: Jun. 5, 2018

(54) SYSTEMS FOR PRECISION APPLICATION OF CONDUCTIVE ADHESIVE PASTE ON PHOTOVOLTAIC STRUCTURES

(71) Applicant: SolarCity Corporation, San Mateo, CA (US)

(72) Inventors: Pablo Gonzalez, Fremont, CA (US); Bobby Yang, Los Altos Hills, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days. days.

(21) Appl. No.: 14/866,806

(22) Filed: Sep. 25, 2015

(65) Prior Publication Data

US 2016/0163912 A1    Jun. 9, 2016

Related U.S. Application Data

(60) Provisional application No. 62/143,694, filed on Apr. 6, 2015, provisional application No. 62/088,509, filed on Dec. 5, 2014.

(51) Int. Cl.
*H01L 31/18* (2006.01)
*B05C 11/10* (2006.01)
(Continued)

(52) U.S. Cl.
CPC ...... *H01L 31/1876* (2013.01); *B05B 13/0431* (2013.01); *B05C 11/1023* (2013.01);
(Continued)

(58) Field of Classification Search
CPC ............ H01L 51/0005; H01L 51/0004; H01L 51/0022; H01L 31/022425;
(Continued)

(56) References Cited

U.S. PATENT DOCUMENTS 2,938,938 A    5/1960  Dickson, Jr.
3,116,171 A   12/1963  Nielsen et al.
(Continued)

FOREIGN PATENT DOCUMENTS

DE    4030713 A1    4/1992
EP   1 057 542 A2  12/2000
(Continued)

OTHER PUBLICATIONS

International Search Report dated Mar. 10, 2016, for International Patent Application No. PCT/US2015/064138, 5 pages.
(Continued)

*Primary Examiner* — Karl Kurple
(74) *Attorney, Agent, or Firm* — Kilpatrick Townsend & Stockton LLP

(57) ABSTRACT

One embodiment of the invention provides an apparatus for dispensing conductive paste on photovoltaic structures during manufacturing of a solar panel. The apparatus includes a cartridge for holding the conductive paste, a jet-dispensing module coupled to the cartridge, and a robotic arm coupled to the jet-dispensing module. The jet-dispensing module is configured to dispense a predetermined amount of the conductive paste on busbars of a respective photovoltaic structure in a non-contact manner, and the robotic arm is configured to adjust a position of the jet-dispensing module, thereby facilitating alignments between the jet-dispensing module and the busbars of the photovoltaic structure.

8 Claims, 14 Drawing Sheets

(51) Int. Cl.
*B05B 13/04* (2006.01)
*B29C 47/02* (2006.01)
*B05B 12/12* (2006.01)

(52) U.S. Cl.
CPC ........ *B05C 11/1034* (2013.01); *B29C 47/026* (2013.01); *H01L 31/188* (2013.01); *B05B 12/124* (2013.01); *Y02E 10/50* (2013.01)

(58) Field of Classification Search
CPC ............ H01L 31/02008; H01L 31/046; H01L 31/0504; H01L 31/1876; H01L 31/0201; H01L 31/042; H01L 31/0512; H01L 2224/76155; H01L 2224/82102; H01L 27/14685; B05C 11/1034; B05C 11/1042; B41J 2/01; B41J 2/2135; H05B 3/84; B60S 1/586; B05B 17/0607; B05B 12/12; B05B 1/02; B05B 5/16; B05B 9/0423
See application file for complete search history.

(56) References Cited

U.S. PATENT DOCUMENTS

| | | |
|---|---|---|
| 3,459,597 A | 8/1969 | Baron |
| 3,679,132 A * | 7/1972 | Vehe ........................ B05B 1/083 239/102.2 |
| 4,267,003 A * | 5/1981 | Mesch .............. H01L 21/67126 136/256 |
| 4,435,719 A * | 3/1984 | Snaper ..................... B41J 2/04 347/82 |
| 4,577,051 A | 3/1986 | Hartmann |
| 4,652,693 A | 3/1987 | Bar-On |
| 4,877,460 A | 10/1989 | Flödl |
| 5,118,361 A | 6/1992 | Fraas et al. |
| 5,151,377 A | 9/1992 | Hanoka et al. |
| 5,178,685 A | 1/1993 | Borenstein et al. |
| 5,411,897 A | 5/1995 | Harvey et al. |
| 6,232,545 B1 | 5/2001 | Samaras et al. |
| 6,248,948 B1 * | 6/2001 | Nakagawa ............. H01L 31/042 136/244 |
| 6,303,853 B1 | 10/2001 | Fraas et al. |
| 6,441,297 B1 | 8/2002 | Keller et al. |
| 6,538,193 B1 | 3/2003 | Fraas |
| 6,620,645 B2 | 9/2003 | Chandra et al. |
| 6,803,513 B2 | 10/2004 | Beernink et al. |
| 7,323,634 B2 * | 1/2008 | Speakman ........... H01G 9/2031 136/252 |
| 7,328,534 B2 | 2/2008 | Dinwoodie |
| 7,388,146 B2 | 6/2008 | Fraas et al. |
| 7,635,810 B2 | 12/2009 | Luch |
| 7,749,883 B2 | 7/2010 | Meeus |
| 7,772,484 B2 | 8/2010 | Li et al. |
| 7,777,128 B2 | 8/2010 | Montello et al. |
| 7,825,329 B2 | 11/2010 | Basol |
| 7,829,781 B2 | 11/2010 | Montello et al. |
| 7,829,785 B2 | 11/2010 | Basol |
| 7,872,192 B1 | 1/2011 | Fraas et al. |
| 7,872,193 B2 | 1/2011 | Ogawa et al. |
| 8,168,880 B2 | 5/2012 | Jacobs |
| 8,209,920 B2 | 7/2012 | Krause et al. |
| 8,222,513 B2 | 7/2012 | Luch |
| 8,322,300 B2 * | 12/2012 | Pavani .............. H01L 31/02161 118/244 |
| 8,343,795 B2 | 1/2013 | Luo et al. |
| 8,586,857 B2 | 11/2013 | Everson et al. |
| 8,691,326 B2 | 4/2014 | Kojo et al. |
| 8,816,513 B2 * | 8/2014 | Romig .................. H05K 3/125 257/784 |
| 8,916,415 B2 | 12/2014 | Biro et al. |
| 8,945,986 B2 * | 2/2015 | Romig .................. H05K 3/125 257/784 |
| 2002/0022132 A1 * | 2/2002 | Ebisawa ................ C03C 17/36 428/432 |
| 2002/0056473 A1 * | 5/2002 | Chandra ................. C23C 4/00 136/256 |
| 2003/0000571 A1 | 1/2003 | Wakuda et al. |
| 2003/0121228 A1 | 7/2003 | Stoehr et al. |
| 2003/0201007 A1 | 10/2003 | Fraas et al. |
| 2004/0016456 A1 * | 1/2004 | Murozono ........ H01L 31/02008 136/250 |
| 2004/0036731 A1 * | 2/2004 | Ready .................. H01L 21/288 347/19 |
| 2004/0247790 A1 * | 12/2004 | Moriyama .......... H01L 51/0004 427/256 |
| 2005/0056213 A1 * | 3/2005 | Iimori ................... B05C 5/0216 118/410 |
| 2005/0056713 A1 * | 3/2005 | Tisone ............... B01D 19/0047 239/690 |
| 2005/0225686 A1 * | 10/2005 | Brummack ........... G02F 1/1335 349/1 |
| 2005/0257823 A1 | 11/2005 | Zwanenburg |
| 2006/0207646 A1 * | 9/2006 | Terreau ............. B32B 17/10018 136/251 |
| 2006/0289566 A1 * | 12/2006 | Heerdt ................ G05D 23/1934 222/146.5 |
| 2007/0151966 A1 * | 7/2007 | Schwenke ............... B60S 1/586 219/203 |
| 2007/0169806 A1 | 7/2007 | Fork et al. |
| 2007/0169812 A1 * | 7/2007 | Robinson ............. C23C 18/1204 136/262 |
| 2007/0283997 A1 | 12/2007 | Hachtmann et al. |
| 2008/0203965 A1 * | 8/2008 | Katoh .................... H01L 31/042 320/101 |
| 2009/0139557 A1 * | 6/2009 | Rose ........................ H01L 31/18 136/244 |
| 2009/0167817 A1 * | 7/2009 | Orr ........................ B41J 3/4073 347/37 |
| 2010/0037932 A1 * | 2/2010 | Erez ...................... H01L 31/188 136/244 |
| 2010/0043863 A1 | 2/2010 | Wudu et al. |
| 2010/0071752 A1 * | 3/2010 | Vellore ............ H01L 31/02008 136/244 |
| 2010/0147364 A1 | 6/2010 | Gonzalez et al. |
| 2010/0184244 A1 | 7/2010 | Hunt |
| 2010/0193014 A1 | 8/2010 | Johnson et al. |
| 2010/0218799 A1 | 9/2010 | Stefani |
| 2010/0221435 A1 | 9/2010 | Fork et al. |
| 2010/0224230 A1 | 9/2010 | Luch et al. |
| 2011/0156188 A1 | 6/2011 | Tu et al. |
| 2011/0259419 A1 | 10/2011 | Hagemann et al. |
| 2011/0262627 A1 * | 10/2011 | Schwenke ................. H05B 3/86 427/98.4 |
| 2011/0284070 A1 | 11/2011 | Suzuki |
| 2012/0000502 A1 | 1/2012 | Wiedeman et al. |
| 2012/0040487 A1 | 2/2012 | Asthana et al. |
| 2012/0060911 A1 | 3/2012 | Fu et al. |
| 2012/0125391 A1 | 5/2012 | Pinarbasi et al. |
| 2012/0145218 A1 | 6/2012 | Son et al. |
| 2012/0152349 A1 | 6/2012 | Cao et al. |
| 2012/0196029 A1 | 8/2012 | Nelson |
| 2012/0240995 A1 | 9/2012 | Coakley |
| 2012/0248497 A1 | 10/2012 | Zhou et al. |
| 2012/0279548 A1 | 11/2012 | Münch et al. |
| 2012/0285533 A1 * | 11/2012 | Chang ..................... H02S 20/26 136/259 |
| 2012/0318319 A1 | 12/2012 | Pinarbasi et al. |
| 2012/0325282 A1 | 12/2012 | Snow et al. |
| 2013/0096710 A1 | 4/2013 | Pinarbasi et al. |
| 2013/0112234 A1 | 5/2013 | Ishii |
| 2013/0122639 A1 | 5/2013 | Degroot et al. |
| 2013/0152996 A1 | 6/2013 | DeGroot et al. |
| 2013/0206213 A1 | 8/2013 | He et al. |
| 2013/0206221 A1 | 8/2013 | Gannon et al. |
| 2013/0240011 A1 * | 9/2013 | Luch .................. H01L 31/02008 136/244 |
| 2013/0255766 A1 | 10/2013 | Shin et al. |
| 2013/0272833 A1 | 10/2013 | Duncan et al. |
| 2013/0319499 A1 | 12/2013 | Yokochi et al. |
| 2014/0000683 A1 * | 1/2014 | Pretorius ............ H01L 31/02021 136/251 |
| 2014/0054795 A1 * | 2/2014 | Romig .................. H05K 3/125 257/777 |

(56) References Cited

U.S. PATENT DOCUMENTS

| | | |
|---|---|---|
| 2014/0124013 A1 | 5/2014 | Morad et al. |
| 2014/0124014 A1 | 5/2014 | Morad et al. |
| 2014/0127856 A1* | 5/2014 | Romig .................. H05K 3/125 438/106 |
| 2014/0186975 A1* | 7/2014 | Buller .................... H02S 50/00 438/7 |
| 2014/0196768 A1 | 7/2014 | Heng et al. |
| 2015/0013596 A1 | 1/2015 | Matsumoto et al. |
| 2015/0090314 A1 | 4/2015 | Yang et al. |
| 2015/0270410 A1 | 9/2015 | Heng et al. |
| 2015/0349145 A1 | 12/2015 | Morad et al. |
| 2015/0349153 A1 | 12/2015 | Morad et al. |
| 2015/0349161 A1 | 12/2015 | Morad et al. |
| 2015/0349162 A1 | 12/2015 | Morad et al. |
| 2015/0349167 A1 | 12/2015 | Morad et al. |
| 2015/0349168 A1 | 12/2015 | Morad et al. |
| 2015/0349169 A1 | 12/2015 | Morad et al. |
| 2015/0349170 A1 | 12/2015 | Morad et al. |
| 2015/0349171 A1 | 12/2015 | Morad et al. |
| 2015/0349172 A1 | 12/2015 | Morad et al. |
| 2015/0349173 A1 | 12/2015 | Morad et al. |
| 2015/0349174 A1 | 12/2015 | Morad et al. |
| 2015/0349175 A1 | 12/2015 | Morad et al. |
| 2015/0349176 A1 | 12/2015 | Morad et al. |
| 2015/0349190 A1 | 12/2015 | Morad et al. |
| 2015/0349193 A1 | 12/2015 | Morad et al. |
| 2015/0349701 A1 | 12/2015 | Morad et al. |
| 2015/0349702 A1 | 12/2015 | Morad et al. |
| 2015/0349703 A1 | 12/2015 | Morad et al. |

FOREIGN PATENT DOCUMENTS

| | | |
|---|---|---|
| EP | 1 816 684 A2 | 8/2007 |
| EP | 2362430 A1 | 8/2011 |
| EP | 2 677 550 A1 | 12/2013 |
| KR | 2013 0034910 A | 4/2013 |
| WO | 00/44051 A1 | 7/2000 |
| WO | 200089657 A1 | 7/2008 |
| WO | 2013020590 A1 | 2/2013 |
| WO | 2014074826 A2 | 5/2014 |
| WO | 2015/106170 A2 | 7/2015 |
| WO | 2015/183827 A2 | 12/2015 |

OTHER PUBLICATIONS

Written Opinion dated Mar. 10, 2016 for International Patent Application No. PCT/US2015/064138, 8 pages.
International Search Report dated Mar. 14, 2016, for International Patent Application No. PCT/US2015/064090, 6 pages.
Written Opinion dated Mar. 14, 2016, for International Patent Application No. PCT/US2015/064090, 7 pages.

* cited by examiner

SYSTEMS FOR PRECISION APPLICATION OF CONDUCTIVE ADHESIVE PASTE ON PHOTOVOLTAIC STRUCTURES

CROSS-REFERENCE TO OTHER APPLICATIONS

This application claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015; the disclosures of which are incorporated herein by reference in their entirety for all purposes.

This is also related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014; the disclosures of which are incorporated herein by reference in their entirety for all purposes.

FIELD OF THE INVENTION

This generally relates to large-scale, automated fabrication of solar panels, including applying conductive adhesive paste on a busbar of a photovoltaic structure.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Continued advances in photovoltaics are making it possible to generate ever-increasing amounts of energy using solar panels. These advances also help solar energy gain mass appeal from ordinary consumers who wish to reduce their carbon footprint and decrease their monthly energy expenses. However, complete solar panels are typically fabricated manually, which is a time-consuming and error-prone process that makes it costly to mass-produce solar panels in high volumes.

Typical solar panels can be manufactured by constructing continuous strings of complete solar cells, and combining these strings to form a solar panel. A string can include several complete solar cells that overlap one another in a cascading arrangement. Continuous strings of solar cells that form a solar panel exist, and are described in U.S. patent application Ser. No. 14/510,008, filed Oct. 8, 2014, and entitled "Module Fabrication of Solar Cells with Low Resistivity Electrodes." Producing solar panels with a cascaded cell arrangement can reduce inter-connection resistance between two strips, and can increase the number of solar cells that can fit into a solar panel.

Manufacturing a cascaded panel can involve connecting two photovoltaic structures by edge overlapping the structures so that the metal layers on each side of the overlapped structures establish an electrical connection. This process can be repeated for a number of successive structures until one string of cascaded cells is created. A number of strings are then connected to each other and placed in a frame. One form of cascaded panel, as described in the above-noted patent application, includes a series of strips created by dividing a conventional solar cell into smaller pieces (i.e. the strips). These strips are then cascaded to form a string.

One problem that arises in manufacturing cascaded panels is that precise alignment of strips to ensure proper electrical and physical connections can be difficult. Given the level of precision needed to create a cascaded string, it is not feasible to manufacture such solar panels in volume manually. For example, cascading the strips may involve depositing conductive paste on busbars, and manual application of the conductive paste with high precision and in large volume is not possible.

SUMMARY

One embodiment provides an apparatus for dispensing conductive paste on photovoltaic structures during manufacturing of a solar panel. The apparatus can include a cartridge for holding the conductive paste, a jet-dispensing module coupled to the cartridge, and a robotic arm coupled to the jet-dispensing module. The jet-dispensing module can be configured to dispense a predetermined amount of the conductive paste on busbars of a respective photovoltaic structure in a non-contact manner, and the robotic arm can be configured to adjust a position of the jet-dispensing module, thereby facilitating alignments between the jet-dispensing module and the busbars of the photovoltaic structure.

The cartridge can, for example, include a temperature control mechanism configured to keep the conductive paste at a temperature lower than a predetermined temperature. And, while dispensing the predetermined amount of conductive paste, the jet-dispensing module can be configured to propel droplets of conductive paste onto the busbars.

The robotic arm can, for example, adjust the position of the jet-dispensing module in such a way that droplets of conductive paste propelled onto a respective busbar are substantially aligned along a longitudinal axis of the busbar.

The droplets can have a volume, for example, between 10 and 20 nanoliters, and a diameter, for example, between 300 and 400 microns. The distance between adjacent droplets can be 2 mm or more. In one embodiment, between 60 and 70 droplets can be deposited on each busbar with equal or non-equal spacing. A droplet can include a plurality of conductive particles with a total volume of the conductive particles between 50% and 90% of the droplet's volume.

In a variation on this embodiment, the robotic arm can be configured to remain stationary while the jet-dispensing module is dispensing conductive paste on the photovoltaic structure, which can be carried on a conveyor that moves in a direction substantially aligned to the busbars, thereby facilitating the jet-dispensing module to dispense the conductive paste along the busbars. In a further variation, the jet-dispensing module can include, for example, multiple paste outlets configured to simultaneously dispense the conductive paste on multiple busbars of the photovoltaic structure. The arm can be configured to rotate the jet-dispensing module in such a way that each of the multiple paste outlets is aligned to an individual busbar of the photovoltaic structure, and/or independently adjust a location of each paste outlet.

The system can further optionally include a vision module configured to detect locations of the busbars and output the detected locations of the busbars to the robotic arm. This can help the robotic arm to adjust the position of the jet-dispensing module. The vision module can be, for example, a laser-vision module, a camera system, or the like.

DETAILED DESCRIPTION

Figure 1A:
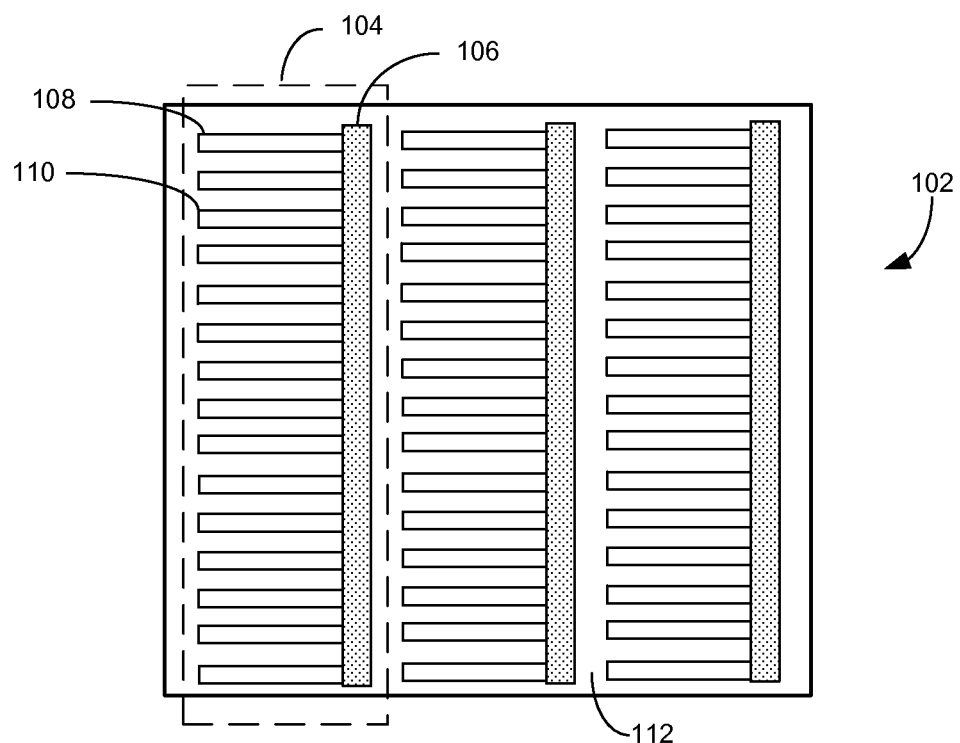
FIG. 1A shows an exemplary metal grid pattern on the front surface of a photovoltaic structure, according to one embodiment of the invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

Embodiments of the invention solve at least the technical problem of large-scale manufacturing of solar panels with precision by providing an automated system for dispensing conductive paste onto photovoltaic strips to facilitate cascaded connection of the strips. More specifically, the automated paste-dispensing system can include multiple nozzles that can concurrently dispense conductive paste onto multiple metal busbars positioned on the surface of a photovoltaic structure. In some embodiments, the paste-dispensing system can include jet valves to enable non-contact paste dispensing. A photovoltaic structure may have been pre-scribed and can be subsequently cleaved into multiple smaller strips. The paste-dispensing system can dispense droplets of conductive adhesive paste (sometimes referred to as "conductive paste" or simply "paste" herein) along the edge of each smaller strip, thereby facilitating subsequent cascading and bonding between these strips. The size and location of the paste droplets can be controlled to ensure sufficient bonding and electrical coupling without paste overflow.

During fabrication, photovoltaic structures, which can include multi-layer semiconductor structures, may first be fabricated using crystalline silicon wafers. In some embodiments, the multi-layer semiconductor structure can include a double-sided tunneling heterojunction solar cell. The photovoltaic structures can be based on any size wafers (e.g., 5-inch or 6-inch wafers) and may have the shape of a square or pseudo square with chamfered or rounded corners. Other shapes are possible as well. In some embodiments, the photovoltaic structures may be 6×6 inch square-shaped cells. Subsequently, front- and back-side conductive grids may be deposited on the front and back surfaces of the photovoltaic structures respectively to complete the bifacial photovoltaic structure fabrication (see FIGS. 1A and 1B).

In some embodiments, depositing the front- and back-side conductive grids may include depositing (e.g., electroplating) a Cu grid, which may be subsequently coated with Ag or Sn. In other embodiments, one or more seed metallic layers, such as a seed Cu or Ni layer, can be deposited onto the multi-layer structures using a physical vapor deposition (PVD) technique to improve adhesion and ohmic contact quality of the electroplated Cu layer. Different types of conductive grids can be formed, including, but not limited to: a grid with a single busbar at the center and a grid with a single busbar at the cell edge. In the "edge-busbar" configuration, the busbars at the front and back surfaces of the multi-layer structure may be placed at opposite edges, respectively.

Solar Panel Based on Cascaded Strips

Some conventional solar panels include a single string of serially connected standard-size, undivided photovoltaic structures. As described in U.S. patent application Ser. No. 14/563,867, it can be desirable to have multiple (such as 3) strings, each string including cascaded strips, and connect these strings in parallel. Such a multiple-parallel-string panel configuration provides the same output voltage with a reduced internal resistance. In general, a cell can be divided into n strips, and a panel can contain n strings, each string having the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string. Therefore, in general, the greater n is, the lower the total internal resistance of the panel is, and the more power one can extract from the panel. However, a tradeoff is that as n increases, the number of connections required to inter-connect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, conventional silver-paste or aluminum based electrode may require n to be greater than 4, because process of screen printing and firing silver paste onto a cell does not produce ideal resistance between the electrode and underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n is selected to be three, which is less than the n value generally needed for cells with silver-paste electrodes or other types of electrodes. Correspondingly, two grooves can be scribed on a single cell to allow the cell to be divided to three strips.

In addition to lower contact resistance, electro-plated copper electrodes can also offer better tolerance to micro cracks, which may occur during a cleaving process. Such micro cracks might adversely impact silver-paste-electrode cells. Plated-copper electrode, on the other hand, can preserve the conductivity across the cell surface even if there are micro cracks in the photovoltaic structure. The copper electrode's higher tolerance for micro cracks allows one to use thinner silicon wafers to manufacture cells. As a result, the grooves to be scribed on a cell can be shallower than the grooves scribed on a thicker wafer, which in turn helps increase the throughput of the scribing process. More details on using copper plating to form low-resistance electrode on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure, according to one embodiment of the present invention. In the example shown in FIG. 1A, grid 102 can include three sub-grids, such as sub-grid 104. This three sub-grid configuration allows the photovoltaic structure to be divided into three strips. To enable cascading, each sub-grid needs to have an edge busbar, which can be located either at or near the edge. In the example shown in FIG. 1A, each sub-grid includes an edge busbar ("edge" here refers to the edge of a respective strip) running along the longer edge of the corresponding strip and a plurality of parallel finger lines running in a direction parallel to the shorter edge of the strip. For example, sub-grid 104 can include edge busbar 106, and a plurality of finger lines, such as finger lines 108 and 110. Alternatively, a sub-grid can include an edge busbar running along the shorter edge of the strip and a plurality of parallel finger lines running in a direction parallel to the longer edge of the strip. To facilitate the subsequent laser-assisted scribe-and-cleave process, a predefined blank space (i.e., space not covered by electrodes) is inserted between the adjacent sub-grids. For example, blank space 112 separates two adjacent sub-grids. In some embodiments, the width of the blank space, such as blank space 112, can be between 0.1 mm and 5 mm, preferably between 0.5 mm and 2 mm. There is a tradeoff between a wider space that leads to more tolerant scribing operation and a narrower space that leads to more effective current collection. In a further embodiment, the width of such a blank space can be approximately 1 mm.

Figure 1B:
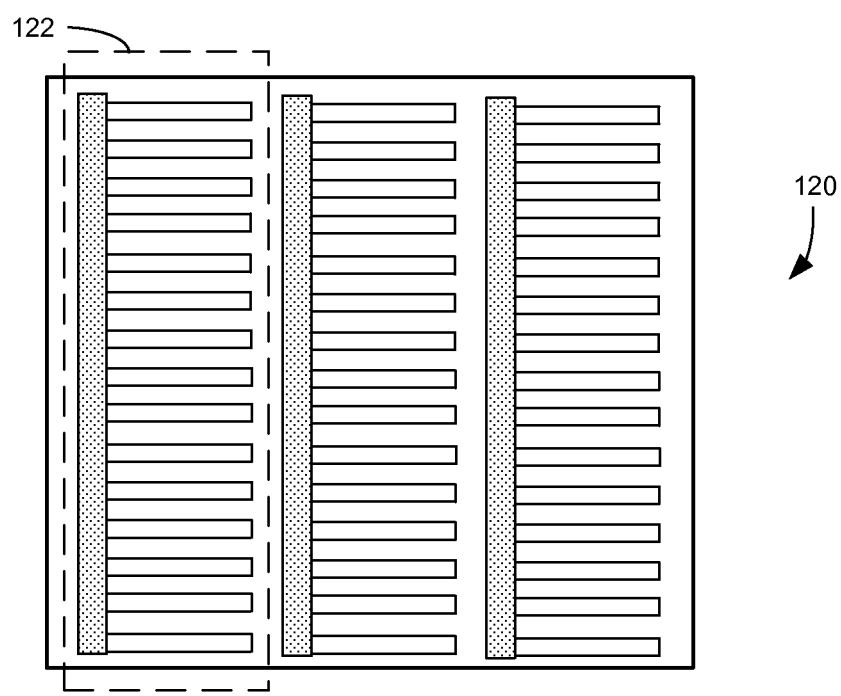
FIG. 1B shows an exemplary metal grid pattern on the back surface of a photovoltaic structure, according to one embodiment of the invention.

FIG. 1B shows an exemplary grid pattern on the back surface of a photovoltaic structure, according to one embodiment of the invention. In the example shown in FIG. 1B, back grid 120 includes three sub-grids, such as sub-grid 122. To enable cascaded and bifacial operation, the back sub-grid needs to correspond to the frontside sub-grid. More specifically, the back edge busbar needs to be located at the opposite edge of the frontside edge busbar. In the examples shown in FIGS. 1A and 1B, the front and back sub-grids have similar patterns except that the front and back edge busbars are located adjacent to opposite edges of the strip. In addition, locations of the blank spaces in back metal grid 120 correspond to locations of the blank spaces in front metal grid 102, such that the grid lines do not interfere with the subsequent scribe-and-cleave process. In practice, the finger line patterns on the front- and back-side of the photovoltaic structure may be the same or different.

In the examples shown in FIGS. 1A and 1B, the finger line patterns can include continuous, non-broken loops. For example, as shown in FIG. 1A, finger lines 108 and 110 both include connected loops with rounded corners. This type of "looped" finger line pattern can reduce the likelihood of the finger lines from peeling away from the photovoltaic structure after a long period of usage. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

Figure 2A:
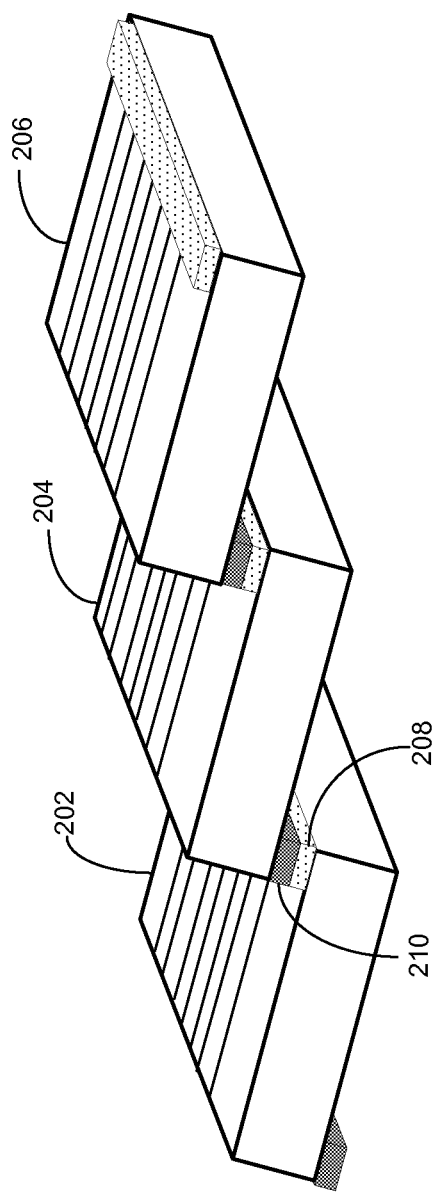
FIG. 2A shows a string of cascaded strips, according to one embodiment of the invention.

To form a cascaded string, strips (as a result of a scribing and cleaving process applied to a regular square-shaped cell) can be cascaded with their edges overlapped. FIG. 2A shows a string of cascaded strips, according to an embodiment of the invention. In FIG. 2A, strips 202, 204, and 206 are stacked in such a way that strip 206 partially overlaps adjacent strip 204, which also partially overlaps (on an opposite edge) strip 202. Such a string of strips forms a pattern that is similar to roof shingles. Each strip includes top and bottom edge busbars located at opposite edges of the top and bottom surfaces, respectively. Strips 202 and 204 are coupled to each other via an edge busbar 208 located at the top surface of strip 202 and an edge busbar 210 located at the bottom surface of strip 204. To establish electrical coupling, strips 202 and 204 are placed in such a way that bottom edge busbar 210 is placed on top of and in direct contact with top edge busbar 208.

Figure 2B:
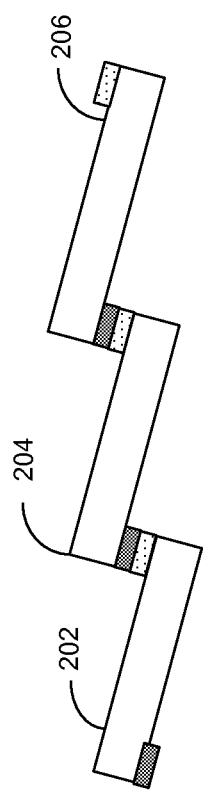
FIG. 2B shows a side view of a string of cascaded strips, according to one embodiment of the invention.

FIG. 2B shows a side view of the string of cascaded strips, according to one embodiment of the invention. In the example shown in FIGS. 2A and 2B, the strips can be part of a 6-inch square-shaped photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) are placed at the edge of the strip (as shown in FIGS. 2A and 2B) but could be placed anywhere that is convenient, such as near the edge. The same cascaded pattern can extend along an entire row of strips to form a serially connected string.

Paste-Dispensing System

The fabrication of a solar panel can typically involve bonding the edge busbars belonging to adjacent cascaded strips to ensure that the electrical connections are well maintained when the solar panel is put into service. One option for bonding the metal busbars can include soldering. For example, the surface of the edge busbars may be coated with a thin layer of Sn, and during a subsequent lamination process, heat and pressure can be applied to cure the soldering material that is placed between the photovoltaic structures and covers. The same heat and pressure can result in the edge busbars that are in contact, such as edge busbars 208 and 210, being soldered together. However, the rigid bonding between the soldered contacts may lead to cracking of the cells. Moreover, when in service, solar panels often experience a large number of temperature cycles, and the thermal mismatch between the metal and the semiconductor may create structural stress that can lead to fracturing.

To reduce the thermal or mechanical stress, it may be preferable to use a bonding mechanism that can be sufficiently flexible and can withstand many temperature cycles. One way to do so is to bond the strips using flexible adhesive that is electrically conductive. For example, one can apply an adhesive paste on the surface of top edge busbar 208 of cell 202 (shown in FIG. 2A). When cell 204 partially overlaps with cell 202, bottom edge busbar 210 can be bonded to top edge busbar 208 by the adhesive, which can subsequently be cured at an elevated temperature.

Different types of conductive paste can be used to bond the busbars. In one embodiment, the conductive paste can include a conductive metallic core surrounded by resin. When the paste is applied to a busbar, the metallic core establishes an electrical connection with the busbar while the resin that surrounds the metallic core functions as an adhesive. In another embodiment, the conductive adhesive may be in the form of a resin that includes a number of suspended conductive particles, such as Ag or Cu particles. The conductive particles may be coated with a protective layer that evaporates when the paste is thermally cured, thereby resulting in electrical conductivity between the conductive particles that are suspended inside the resin.

Various ways can be used to apply the conductive paste to the busbars, including manual applications. However, as discussed previously, the precision and throughput requirements of the panel fabrication make manual methods generally not viable. On the other hand, existing automated fluid-dispensing systems are not designed for the fabrication of solar panels, and often cannot meet the precision and throughput requirements.

In an automated solar panel production line, before the strips are edge stacked to form a cascaded string, conductive paste needs to be applied on the surface of the busbars of each strip. In some embodiments, the conductive paste can be applied before a photovoltaic structure of a standard size is divided into multiple strips. In further embodiments, the conductive paste can be applied after the photovoltaic structure is scribed but before the photovoltaic structure is cleaved into strips. Applying the conductive paste prior to the photovoltaic structure being cleaved into multiple strips simplifies the aligning process required during the paste application. On the other hand, applying the conductive paste after the laser scribing process prevents possible curing of the paste by the laser beams.

Figure 3:
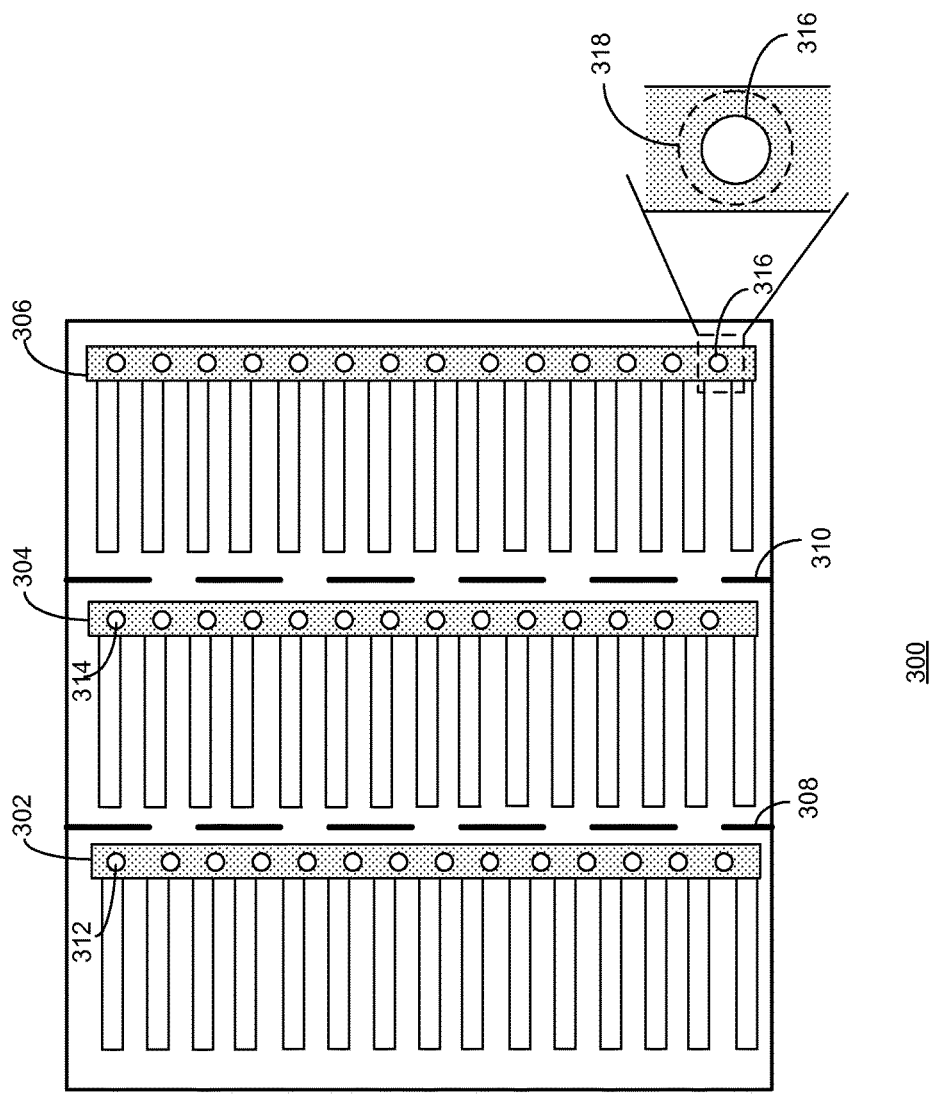
FIG. 3 shows a photovoltaic structure with conductive paste applied on the busbars, according to one embodiment of the invention.

FIG. 3 shows a photovoltaic structure with conductive paste applied onto its busbars, according to an embodiment of the invention. In the example shown in FIG. 3, photovoltaic structure 300 can include three busbars 302, 304, and 306. These busbars can be the edge busbars of the strips obtained after the subsequent cleaving process. On each of the busbars, conductive paste, which can be in the form of individual droplets, a continuous string, or a spray, can be deposited. In the example shown in FIG. 3, the conductive paste can be in the form of droplets. For example, paste droplet 312 is deposited on busbar 302, and paste droplet 314 is deposited on busbar 304. Dashed lines 308 and 310 mark the locations of the laser scribes. In FIG. 3, the droplets are shown as circles. In practice, the paste droplets may be obround in shape because they may be dropped by the paste dispenser while the photovoltaic structure is moving. Moreover, in FIG. 3, photovoltaic structure 300 is shown as a square. In practice, the un-divided photovoltaic structure may have shapes that are different from a square, such as pseudo-squares with chamfered or rounded corners.

After busbar 306 is stacked against another busbar and the paste cured, paste droplets, such as droplet 316, can expand. FIG. 3 also shows an amplified view of paste droplet 316, with dashed circle 318 representing the cured version of paste droplet 316. After curing, the diameter of the paste droplets can expand (e.g., to be twice as large), meaning that the size and location of the droplets need to be controlled when the droplets are initially applied onto the busbars. If the droplets are too large, they may expand beyond the busbar boundary after curing, and may come into contact with the edge of the strip, which can lead to shunting. Even if the overflowing paste does not reach the strip edge but expands toward the other side, it can still be problematic because the overflowing paste can cause additional shading to the strip surface. On the other hand, if the droplets are too small, they may not provide enough adhesive force or electrical conductivity. Diameters of paste droplets can be slightly smaller than (e.g., being between 50% and 90% of) the width of the busbar after the busbars are stacked and the paste cured, as shown in the exploded view of droplet 316.

When designing the busbars, one needs to balance the tradeoff between shading and resistivity. Wider busbars have lower resistivity but larger shading effects, and narrower busbars reduces shading but may have larger resistivity. In some embodiments, the width of the busbars can be between 0.5 and 2 mm, preferably between 0.8 mm and 1.5 mm. If the busbars are designed to be 0.8 mm wide, the diameter of the cured paste droplets should be smaller than 0.8 mm, meaning that the paste droplets, when they were initially deposited, should have a diameter that is much smaller than 800 microns. In some embodiments, the diameter of the paste droplets, when they were initially deposited, can be between 300 and 400 microns. In one embodiment, the diameter variation among the droplets is less than 100 microns.

In addition to the size, one also needs to consider the locations of the droplets. As discussed previously, after curing the paste droplets should be confined to the width of the busbars to prevent overflow. Hence, the preferred location of the droplets can be at the center of the busbars. In some embodiments, the paste droplets can be deposited along a line that is the longitudinal axis of symmetry of the busbar with a tolerance of less than 0.5 mm. Controlling the size of the droplets can be achieved by controlling the amount of paste in each droplet. In general, the relationship between the diameter of the droplet and its volume can be determined by the viscosity of the paste itself. For the same amount of paste, less viscous paste may spread more, forming droplets with a larger diameter. In some embodiments, the conductive paste can include metal particles suspended in resin, and the volume fraction of the metal particles can be between 50% and 90%. The viscosity of such conductive paste can be around 20 Pa·s (Pascal·second). For such paste, to form droplets with a diameter between 300 and 400 microns, each droplet can have a volume that is between 10 and 20 nanoliters (i.e., between $1 \times 10^{-5}$ and $2 \times 10^{-5}$ cubic centimeters). In some embodiments, the volume of a paste droplet can be around 15 nanoliters.

The distance between neighboring droplets should also be considered. In the example shown in FIG. 3, the paste droplets on a busbar are substantially equally spaced, with a well controlled inter-droplet spacing. If the droplets are too close to each other, they may overlap during expansion, which can lead to paste overflow. On the other hand, if they are too far apart, they may not provide sufficient adhesive force. In some embodiments, the distance between adjacent droplets can be between 2 and 3 mm. Additionally, at locations where a probe-test is subsequently performed, larger spaces (e.g., greater than 8 mm) between paste droplets can be provided. In general, for photovoltaic structures that are 6 inches wide, around 50-80 paste droplets can be deposited onto each busbar. In further embodiments, about 60-70 droplets of paste are deposited onto each busbar.

An automated paste-dispensing system that is able to dispense very small but consistent volumes of paste at a high speed is needed to meet the precision and throughput requirements of manufacturing solar panels based on cascaded strips. There are various ways of dispensing droplets of fluid. For example, some systems may use a syringe with a needle tip to dispense droplets of fluid with the needle moving up and down (e.g., the Dotliner of Martin®, which dispenses solder paste onto printed-circuit boards); other systems may rely on a mechanism similar to an inkjet printer, which propels droplets of liquid out of a microscopic nozzle (e.g., Microdrop Technologies' Nanojet dispenser). Using a syringe with a needle often requires movements of the needle (e.g., the needle needs to be lowered to the surface to dispense fluid), which can be too slow. In contrast, the non-contact nature of the jet-printing technology makes it the preferred solution for applying conductive paste on the busbars. Compared with an existing inkjet printer that may use hundreds of nozzles to print characters or figures, fewer nozzles are needed to dispense conductive paste on photovoltaic structures.

Figure 4A:
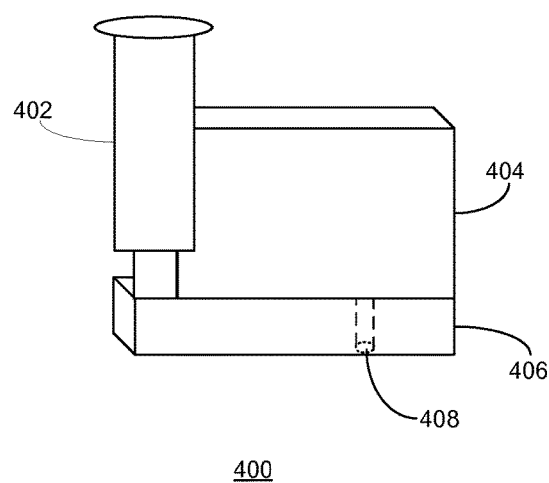
FIG. 4A shows an exemplary paste dispenser, according to one embodiment of the invention.

FIG. 4A shows an exemplary paste dispenser, according to an embodiment of the invention. In FIG. 4, paste dispenser 400 can include paste cartridge 402, flow controller house 404, and nozzle 406. Paste cartridge 402 holds the to-be-deposited conductive paste, which can be resin based. To prevent premature hardening of the resin-based paste at room temperature (e.g., 20° C.), paste cartridge 402 can include a thermally insulating chamber for maintaining the conductive paste at a lower temperature. More specifically, after mixing, the conductive paste can be cooled to a very low temperature and can be placed in the thermally insulating chamber within paste dispenser 400. The thermally insulating chamber can maintain the property of the conductive paste for a prolonged time period (e.g., a few hours). Alternatively, paste cartridge 402 may be placed in a container that can include a cooling agent (e.g., ice, dry ice, liquid nitrogen, etc.) to keep the conductive paste at a low temperature for a prolonged period. In addition to the passive temperature control, in some embodiments, paste cartridge 402 may also include an active temperature control mechanism (e.g., a vapor-compression refrigeration mechanism, a vapor-absorption refrigeration mechanism, a thermoelectric cooling mechanism, etc.) that can continuously keep the conductive paste at a low temperature.

Flow controller house 404 houses the controlling mechanism (not shown) for dispensing the paste. Various fluid dispensing mechanisms can be used, including but not limited to: thermal bubble, piezoelectric actuating, pneumatic actuating using compressed clean dry air (CDA), etc. In particular, the controlling mechanism can control the amount of paste dispensed in each droplet. In some embodiments, the controlling mechanism can be configured to ensure that each droplet has a volume that can be between 10 and 20 nanoliters. Nozzle 406 is coupled to the controlling mechanism housed in flow controller house 404 and can include microscopic opening 408, from which the paste droplets are propelled out of nozzle 406.

Figure 4B:
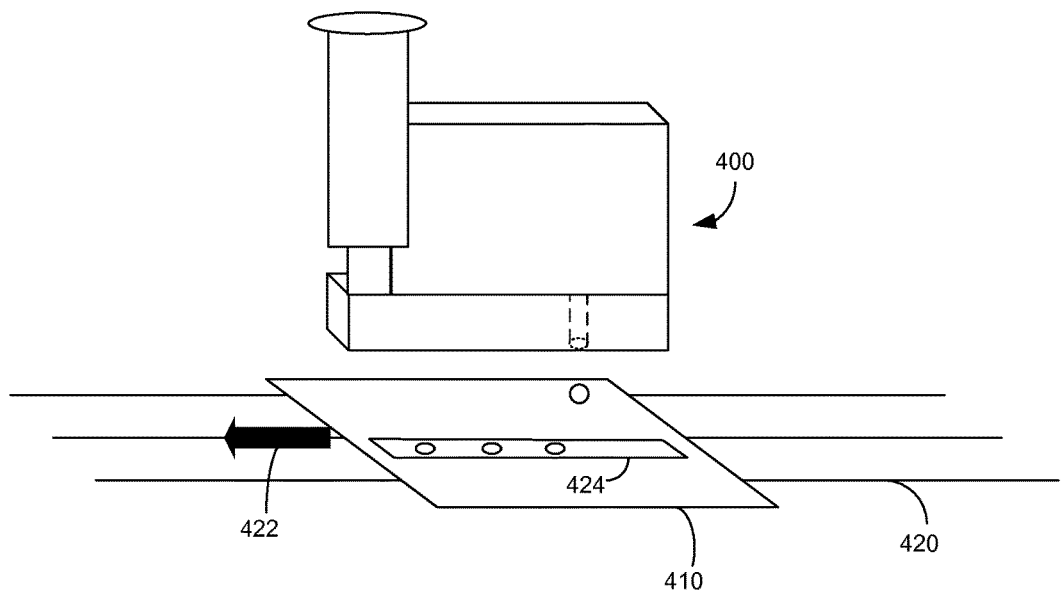
FIG. 4B shows a paste dispenser dispensing droplets of conductive paste onto a busbar of a photovoltaic structure, according to an embodiment of the invention.

FIG. 4B shows a paste dispenser dispensing droplets of conductive paste onto a busbar of a photovoltaic structure, according to an embodiment of the invention. In FIG. 4B, photovoltaic structure 410 is placed on a conveyor 420, which can be a belt-, roller-, or chain-driven conveyor. In most automated systems that manufacture solar panels, a conveyor can be used to transport photovoltaic structures. In a production line, the conveyor may transport photovoltaic structures from a start point to an end point (e.g., from one work station to another work station), and a distance between the two points can be at least twice or three times the length of the photovoltaic structures. The work stations can include, but are not limited to: scribing, paste application, cleaving, testing, string lay-up, and annealing.

In the example shown in FIG. 4B, arrow 422 indicates the moving direction of conveyor 420. As discussed previously, photovoltaic structure 410 has been scribed (e.g., via a laser-scribing process) but not yet cleaved. Moreover, to prevent possible damages cause by the laser beam to the base-to-emitter junction of a photovoltaic structure, it is desirable to perform laser scribing on a side of the base layer that is opposite to the emitter. If photovoltaic structure 410 includes a surface-field layer, it is desirable to apply the laser beam on the side of the surface-field layer. In such scenarios, it is easier to ensure that a groove generated by the laser beam does not penetrate the base layer to reach the base-to-emitter interface. To accommodate the scribing operation, photovoltaic structures (e.g., structure 410) are placed on the conveyors with the top-facing side being the side of the surface-field layer. Consequently, when conductive paste is applied, it is applied the surface-field-layer side of photovoltaic structure 410.

To ensure that photovoltaic structures do not shift their positions while being transported by the conveyor, in some embodiments, conveyor 420 may include a vacuum holding mechanism that holds the structures in place. For example, the top surface of the conveyor may include holes that can produce a weak vacuum between the conveyor surface and a photovoltaic structure covering these holes. The weak vacuum can create a suction force to hold the photovoltaic structures in place without damaging them. Alternatively, conveyor 420 may include borders or edges that can physically confine the photovoltaic structures, such as restricting movements of photovoltaic structures in the direction perpendicular to the moving direction of conveyor 420. For example, the width of the conveyor may match the width of the photovoltaic structures, so that once the structures are loaded onto the conveyor, they no longer are able to move laterally. The movement of the conveyor can be continuous or intermittent. For example, the conveyor may stop to allow paste dispenser 400 to dispense paste or have its paste cartridge refilled; or the conveyor may remain in motion while paste dispenser 400 is dispensing paste.

During panel production, paste dispenser 400 can be positioned over conveyor 420, and can be configured to eject, at predetermined intervals, droplets of paste. Hence, as photovoltaic structure 410 is moving along with conveyor 420, paste dispenser 400 may deposit droplets of paste along a straight line aligned to the moving direction of conveyor 420. By arranging the relative positions between paste dispenser 400 and photovoltaic structure 410, one can ensure that the paste droplets are deposited at desired locations, such as on top of busbar 424. As discussed previously, to prevent paste overflow, the droplets of paste should fall approximately at the center of busbar 424.

In some embodiments, paste dispenser 400 can have a fixed position. For example, paste dispenser 400 may be attached to a stationary post (not shown in FIG. 4B) and may remain stationary while conveyor 420 moves along a path. By controlling the speed of the conveyor and the paste-dispensing frequency of paste dispenser 400, one can control the spacing between the dispensed droplets. For example, a constant speed of the conveyor and a constant paste-dispensing frequency may result in equal spacing. On the other hand, a variable conveyor speed or a variable paste-dispensing frequency can result in variable spacing. Moreover, the conveyor speed and the paste-dispensing frequency also determine the size of the spacing. As discussed previously, to achieve appropriate adhesion and electrical conduction without causing paste overflow, the system can be configured to allow between 60 and 70 droplets of conductive paste deposited onto a busbar that is approximately 6 inches long. To ensure that the droplets land at desired locations, one may need to position photovoltaic structure 410 in such a way that busbar 424 remains substantially aligned to the nozzle of paste dispenser 400 while photovoltaic structure 410 is moved by the conveyor.

Given that the photovoltaic structures can include thin Si wafers that are fragile and can be prone to fracturing when handled, it is preferable to move the paste dispenser in order to align the paste dispenser and the photovoltaic structure. In some embodiments, the paste dispenser is attached to an arm that is free to move in the horizontal plane. In some embodiments, the movement of the arm can be manually controlled. For example, during the system initialization, an operator may manually adjust the arm holding the paste dispenser to ensure that droplets of paste can land at the approximate center of the busbar on the photovoltaic structure. The arm may be attached to a translation stage, and actuators with micrometer heads can be used to adjust the position of the paste dispenser. If dispensing the conductive paste occurs immediately after laser scribing, one may assume that the position of the photovoltaic structures has been calibrated by the laser scribing tool, and only minor adjustments to the position of the paste dispenser is needed. In some embodiments, once the production line is running, the relative positions among photovoltaic structures on the conveyor can be pre-determined, meaning that once aligned to one photovoltaic structure, the paste dispenser can be automatically aligned to other photovoltaic structures carried by the conveyor.

However, requiring that all photovoltaic structures have precisely controlled positions on the conveyor can be challenging. If the photovoltaic structures have shifted their positions while being transported by the conveyor, the position of the paste dispenser may need to be adjusted accordingly. Given the throughput consideration, manual adjustment may not be an option. To enable dynamic, automated position control of the paste dispenser, in some embodiments of the present invention, the paste dispenser can be attached to a robotic arm that can have at least two degrees of freedom. For example, the robotic arm may be able to move left-and-right (swaying) and forward-and-backward (surging) within the horizontal plane. Additionally, the robotic arm may also be able to rotate within the horizontal plane (yawing). The robotic arm can be automatically controlled, by a controlling mechanism, to move freely in the horizontal plane to align the nozzle position of the paste dispenser to the busbar of a photovoltaic structure. To enhance the precision, the control of the robotic arm may include a feedback loop, which measures the location of the robotic arm and sends such information back to the control.

To move the paste dispenser to an appropriate position, the robotic arm needs to know the location of the busbar on the photovoltaic structure. In some embodiments, the busbar location can be obtained by a vision system, such as a laser-based vision system. For example, a laser beam scanning the surface of the photovoltaic structure can locate the busbar due to the difference in refractive indices between the conductive busbar and the semiconductor surface of the photovoltaic structure. Alternatively, the laser beam can also be used to determine the locations of the leading and trailing edges of the photovoltaic structure based on the difference in refractive indices between the surface of the photovoltaic structure and the surface of the conveyor. The locations of the busbars can then be derived from the locations of the leading and trailing edges. In addition to laser visioning, in some embodiments, the system can also include a position-verification module. The position-verification module can include a camera that can take a picture or record an image of the photovoltaic structure on the conveyor. The recorded image may then be compared, via an image-processing software application, to a sample image of a photovoltaic structure at a predetermined location on the conveyor. The comparison result can indicate the current location of the photovoltaic structure. Such location information can be sent to the controller of the robotic arm to control the movement of the robotic arm accordingly in order to align the paste dispenser to the busbar. Considering a special case where the photovoltaic structure is tilled at an angle on the conveyor, meaning that the busbar no longer aligns to the moving direction of the conveyor, the robotic arm may need to adjust the position of the paste dispenser for each dispensed droplet in order to ensure that every droplet of the conductive paste lands approximately at the center of the busbar.

Figure 4C:
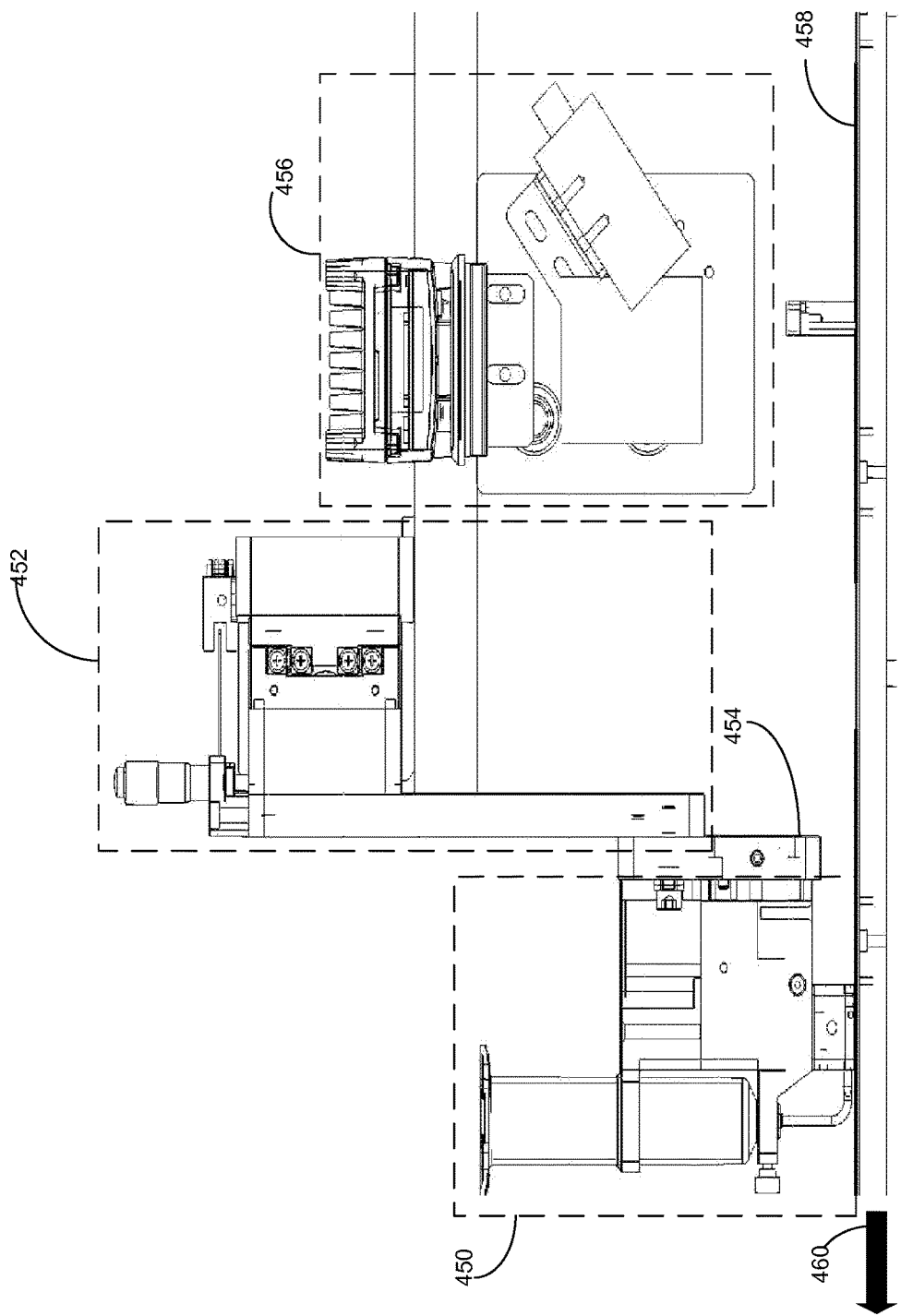
FIG. 4C shows an exemplary paste dispenser attached to a robotic arm, according to an embodiment of the invention.

FIG. 4C shows an exemplary paste dispenser attached to a robotic arm, according to an embodiment of the invention. In the example shown in FIG. 4C, paste dispenser 450 is attached to robotic arm 452 via mounting plate 454. Robotic arm 452 can have at least two degrees of freedom, e.g., it may be able move in-and-out and back-and-forth in the horizontal plane. To accommodate photovoltaic structures of different thicknesses, robotic arm 452 may also be able to move in the vertical direction. Various actuating mechanisms can be used to move robotic arm 452, including but not limited to: mechanical actuators (e.g., screw-driven actuators), electrical actuators (e.g., step motors, piezoelectric actuators, etc.), and pneumatic actuators. FIG. 4C also shows vision module 456, which can be used to determine the position of the busbars. In some embodiments, the control module of robotic arm 452 can control movements of robotic arm 452 based on outputs of vision module 456.

In the example shown in FIG. 4C, vision module 456 can inspect photovoltaic structure 458 prior to photovoltaic structure 458 being transported to a location under paste dispenser 450 for application of the conductive paste. In FIG. 4C, arrow 460 shows the moving direction of the conveyor. Because the conveyor can substantially confine the photovoltaic structures (either by suction forces or by physical boundaries), the possibility of photovoltaic structure 458 shifting its location while being transported from laser-vision module 456 to paste dispenser 450 can be low. Therefore, the control of robotic arm 452 can calculate the amount of displacement needed for paste dispenser 450 based on the output of vision module 456. Placing vision module 456 side by side with paste dispenser 450 as separate modules can provide simplicity in system configurations. In practice, it is also possible to incorporate a vision module inside paste dispenser 450, and have the location determination and the paste application to occur concurrently. However, such an approach requires a more complex system design.

Returning to FIG. 3, one can see that the photovoltaic structure includes more than one busbars, and paste droplets are deposited onto each of the busbars, forming multiple lines of droplets. To accomplish such a task using the system shown in FIG. 4C, one can move paste dispenser 450 in a direction that is vertical to the busbars in order to deposit paste on all busbars. For example, paste dispenser 450 may first move in a direction perpendicular to the busbars to deposit one droplet of paste on each busbar, and then move along the busbars to deposit the next row of droplets. Alternatively, it is also possible for paste dispenser 450 to finish depositing an entire column of droplets along one busbar before moving on to the next busbar. In such scenarios, it is preferable to keep the photovoltaic structure stationary when paste dispenser 450 moves. This means that the conveyor will need to be stopped when paste dispenser 450 dispenses paste droplets on the photovoltaic structure. However, frequent stops of the conveyor slow down the processing speed of the entire system, thus lowering the throughput. On the other hand, requiring the conveyor to stop frequently may also lead to possible mechanical failure.

Figure 5A:
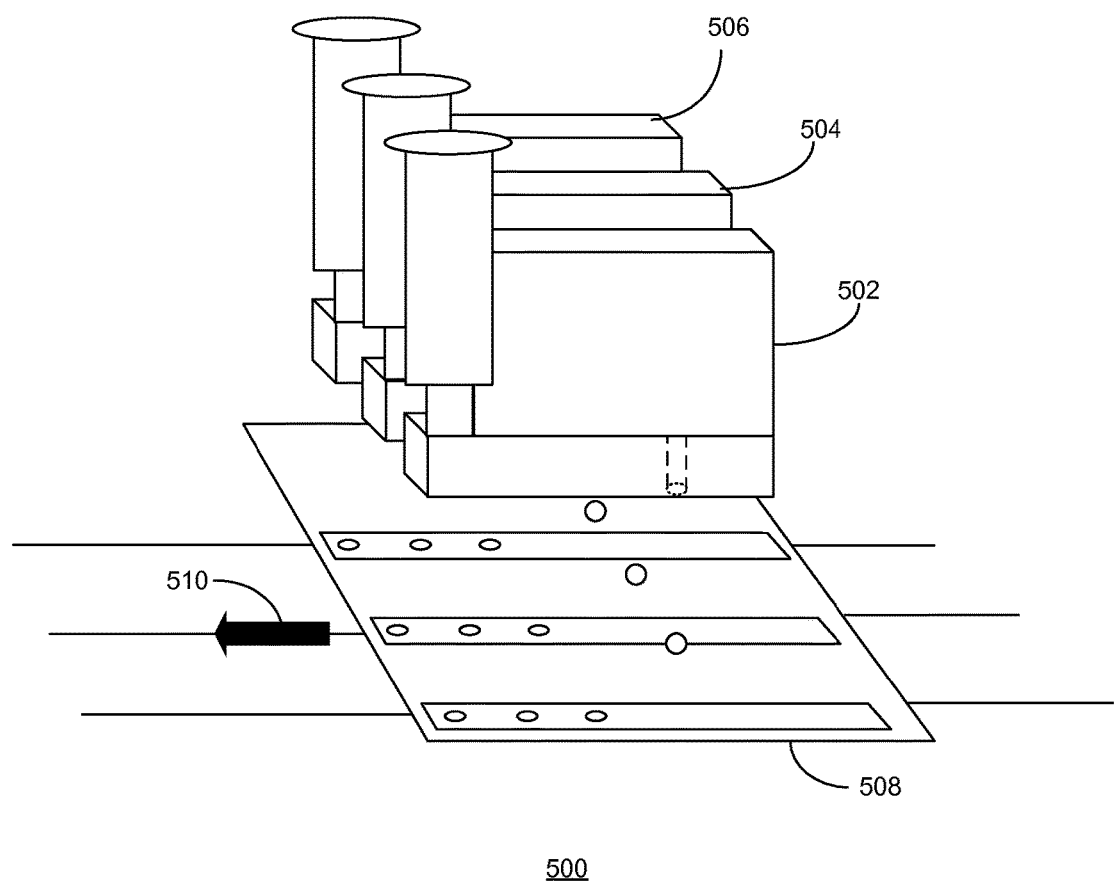
FIG. 5A shows an exemplary paste-dispensing system, according to one embodiment of the invention.

To ensure the high throughput of the solar panel production line, it is desirable to have the conveyor move at a constant speed, even during the application of the conductive paste. FIG. 5A shows an exemplary paste-dispensing system, according to an embodiment of the invention. In the example shown in FIG. 5A, paste-dispensing system 500 includes multiple parallelly positioned paste dispensers, such as paste dispensers 502, 504, and 506. The multiple paste dispensers can be placed in such a way that, as photovoltaic structure 508 is moving along with the conveyor in a direction indicated by arrow 510, each paste dispenser can dispense droplets of conductive paste on an individual busbar. In other words, paste-dispensing system 500 can be capable of simultaneously applying conductive paste on all busbars, and the paste application process can be completed as the photovoltaic structures pass through on the conveyor, thus providing high system throughput. The paste-dispensing actions of dispensers 502, 504, and 506 can be individually controlled by each dispenser. Alternatively, a master timing circuitry may be used to coordinate the paste-dispensing action of all dispensers. Depending on the needs, the dispensers may dispense the paste in sync or alternately.

As discussed previously, the spacing between adjacent droplets needs to be controlled to ensure sufficient adhesive force and electrical conduction while avoiding paste overflow. Moreover, the paste can be expensive, and applying more paste than necessary can increase the panel fabrication cost. In the example shown in FIG. 5A, the inter-droplet distance can be controlled by controlling the paste-dispensing frequency and the moving speed of the conveyor. A higher speed conveyor can improve the overall throughput but will require the paste dispensers to dispense paste at a higher frequency. On the other hand, a slow-moving conveyor can relax the speed requirement of the paste dispensers. In the example shown in FIG. 5A, the droplets are approximately equal spaced, which can be achieved with the conveyor moving at a constant speed and the dispensers dispensing the paste at a constant frequency. In some embodiments, the inter-droplet spacing can be controlled to be between 2 and 3 mm. In certain cases, after subsequent cleaving, the cleaved strips need to be tested. To prevent the test probes from touching the conductive paste, additional space between droplets can be added at the probe locations. In some embodiments, the paste dispensers are configured to create an additional space (which can be up to 8 mm wide) between paste droplets at the predefined probe locations. To do so, the dispenser may pause dispensing at the probe locations, and can dispense normally (with a constant frequency) at other locations on the busbar.

Figure 5B:
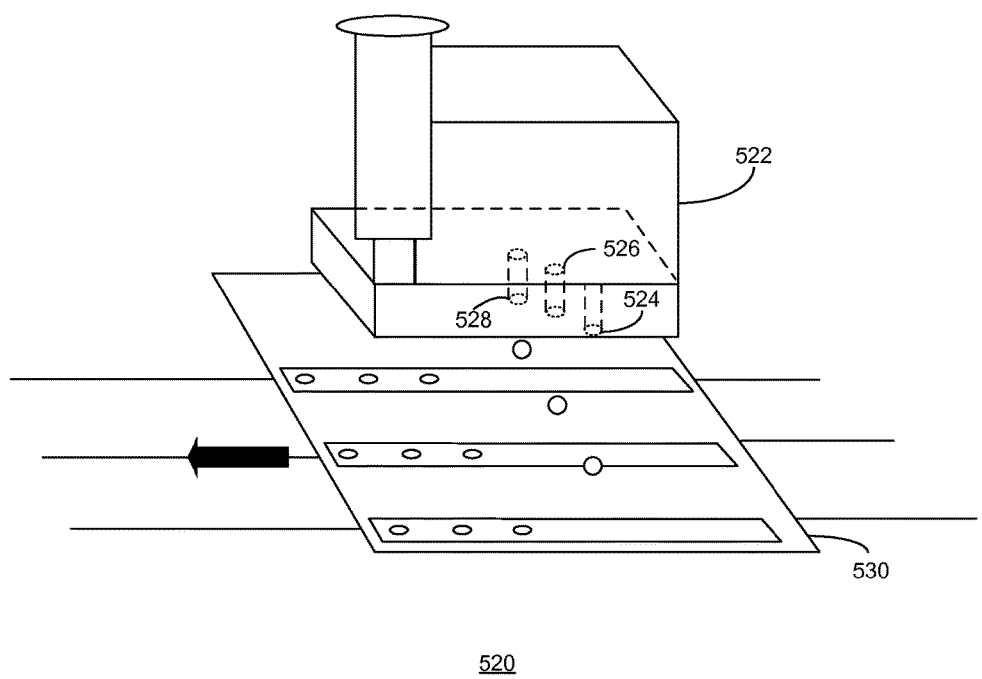
FIG. 5B shows an exemplary paste-dispensing system, according to one embodiment of the invention.

In addition to using multiple parallelly positioned paste dispensers as shown in FIG. 5A, it is also possible to use a single paste dispenser that is equipped with multiple paste-dispensing outlets to simultaneously dispense paste on the multiple busbars. FIG. 5B shows a paste-dispensing system, according to an embodiment of the invention. In FIG. 5B, paste-dispensing system 520 includes a single paste dispenser 522, which is equipped with multiple paste-dispensing outlets, such as outlets 524, 526, and 528. During operation, paste dispenser 522 may simultaneously dispense, via paste-dispensing outlets 524-528, multiple droplets of conductive paste onto photovoltaic structure 530. By carefully designing the locations of the paste-dispensing outlets, one can ensure that the paste droplets can land on the approximate center of the busbars of photovoltaic structure 530. Using a single paste dispenser to apply paste may reduce the equipment cost, including the maintenance cost. However, the solution provided by the example shown in FIG. 5B is less flexible compared to the one shown in FIG. 5A, because one may need to specially design the locations of the paste-dispensing outlets for every busbar design. If the photovoltaic structure has more or fewer busbars (the photovoltaic structure is cut into more or fewer strips), or the distance between the busbars changes, one would need to redesign single paste dispenser 522. On the other hand, using the system shown in FIG. 5A, one only needs to adjust the position of each individual paste dispenser when the busbar configuration changes.

Figure 5C:
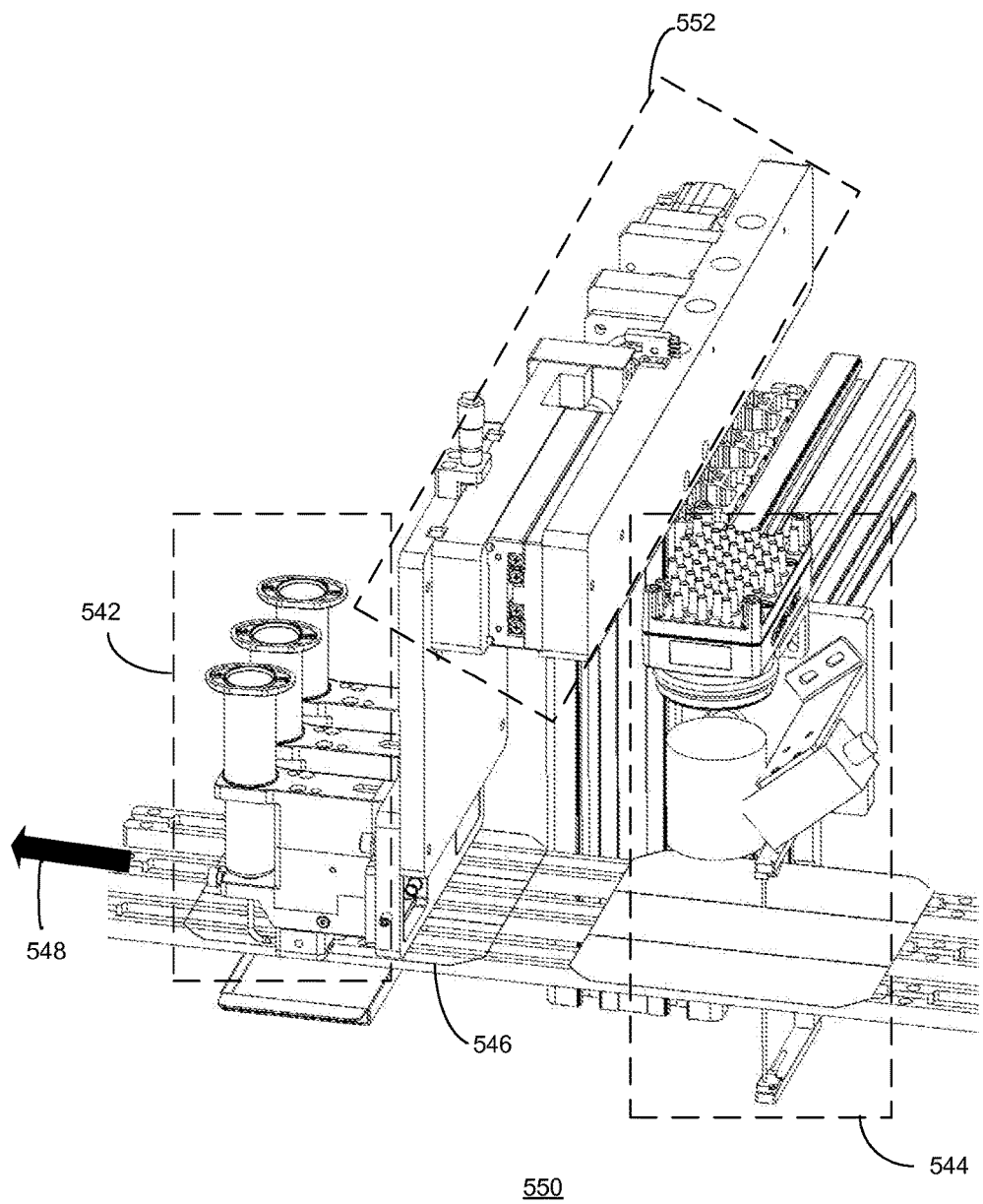
FIG. 5C shows an exemplary paste-dispensing system, according to an embodiment of the invention.

FIG. 5C shows an exemplary paste-dispensing system, according to an embodiment of the invention. In the example shown in FIG. 5C, paste-dispensing system 550 includes paste-dispensing module 542 (which can include multiple dispensers), vision module 544, and robotic arm 552. Photovoltaic structure 546 is placed on the conveyor travelling in a direction indicated by arrow 548. While photovoltaic structure 546 is moving beneath paste-dispensing module 542, paste droplets are deposited onto the multiple busbars on photovoltaic structure 546.

Figure 5D:
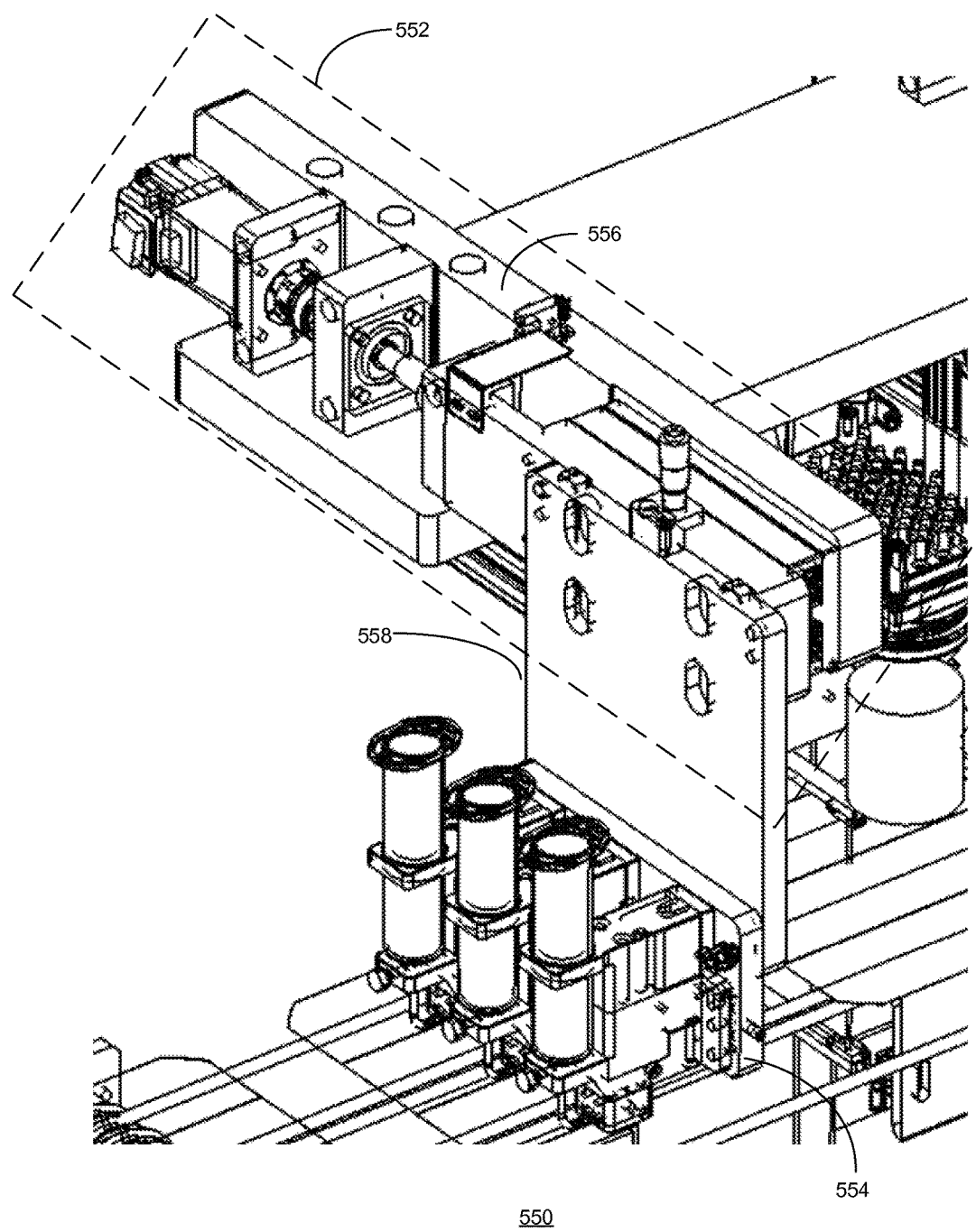
FIG. 5D shows an exemplary paste-dispensing system, according to an embodiment of the invention.

FIG. 5D shows an exemplary paste-dispensing system, according to an embodiment of the invention. More specifically, FIG. 5D shows that the multiple paste dispensers are attached to robotic arm 552 (partially shown in FIG. 5C) via mounting plate 554. During operation, the positions of the paste dispensers can be controlled by robotic arm 552, which has at least three degrees of freedom, including forward-and-backward (along the moving direction of the conveyer), in-and-out (in a direction that is perpendicular to the conveyer moving direction), and yawing (rotating in the horizontal plane). The additional degree of freedom that involves yawing is needed because the photovoltaic structure may not be perfectly aligned to the moving direction of the conveyor.

Moreover, one can see from FIG. 5D that robotic arm 552 includes horizontal beam 556 and vertical plate 558. Horizontal beam 556 can be attached to an external, stationary frame, which can be part of the housing of the solar panel production line. The attachment can be fixed, which means that horizontal beam 556 may remain stationary at all time. Alternatively, horizontal beam 556 may be able to rotate in and out (such as rotate 90° outwards away from the conveyer) to allow exchanges of the paste carriages. Vertical plate 558 can define a plane that is parallel to a plane formed by the paste dispensing outlets and a vertical line. In other words, vertical plate 558 can define a plane that is parallel to the trajectories of the paste droplets. The coupling between vertical plate 558 and horizontal beam 556 can be in such a way that an adjustable angle can be formed between vertical plate 556 and horizontal beam 556. For example, an actuating mechanism can be used to push one edge of vertical plate 556 (such as the edge that is close to the outer most paste dispenser) away from horizontal beam 556, thus controlling the yawing of vertical plate 558. The trajectory of the paste droplets from all dispensers can then be adjusted accordingly to be aligned to the busbars on the photovoltaic structure.

In some embodiments, all paste dispensers may be mounted onto a same mounting plate, with their relative positions fixed. When robotic arm 552 moves, all paste dispensers move accordingly. Such a setup can provide a relatively simple but rather limited solution, and can be suitable to most cases where the photovoltaic structures only tilt slightly on the conveyor. If the tilt of the photovoltaic structure is more significant, attaching all paste dispensers onto a single mounting plate may not provide enough freedom of movement to the paste dispensers to allow conductive paste to be properly applied onto each busbar. To solve such a problem, one can mount the paste dispensers on different individual mounting plates whose relative positions can be adjusted. For example, each paste dispenser may be mounted onto a translational stage that can move the paste dispenser in a direction that is perpendicular to the conveyor moving direction independently of other paste dispensers. This way, each paste dispenser can move independently according to the actual position of the individual busbars. The control of robotic arm 552 may also include mechanisms for controlling the movements of each individual dispenser. For example, each dispenser may be coupled to a dedicated control circuitry that can include its own feedback loop for controlling the movement of the dispenser.

In the examples shown in FIGS. 5A-5D, there are one conveyor moving photovoltaic structures and one paste-dispensing system dispensing conductive paste onto busbars of the photovoltaic structures. In practice, a solar panel production line may have different configurations. For example, the production line may include multiple conveyors operating in parallel, and a paste-dispensing system can be placed over each conveyor to apply conductive paste to photovoltaic structures carried by the conveyor. Alternatively, a paste-dispensing system may be able to service multiple (e.g., two) conveyors, i.e., to apply conductive paste to photovoltaic structures carried by both conveyors. In such a scenario, the robotic arm of the paste-dispensing system may move the dispensers from one conveyor to the next.

Figure 5E:
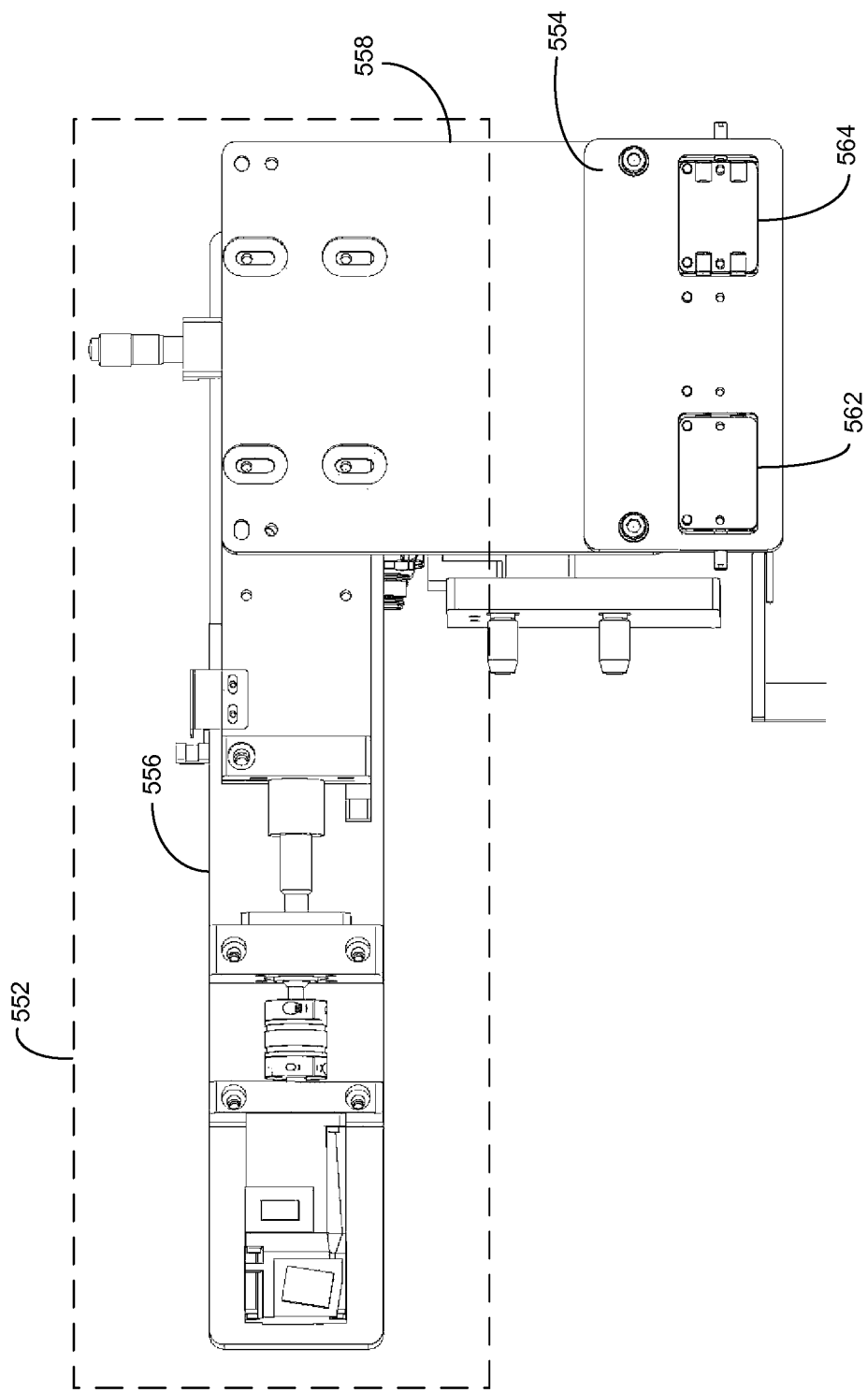
FIG. 5E shows a robotic arm and a mounting plate, according to one embodiment of the invention.

FIG. 5E shows the robotic arm and the mounting plate, according to an embodiment of the invention. More specifically, FIG. 5E shows the front view of robotic arm 552 and mounting plate 554. Mounting plate 554 includes mounting stages 562 and 564 for mounting two side paste dispensers. The center paste dispenser can be directly mounted onto mounting plate 554 via screws. Because mounting stages 562 and 564 are adjustable, positions of the side paste dispensers relative to that of the center paste dispenser can be adjusted.

Figure 6A:
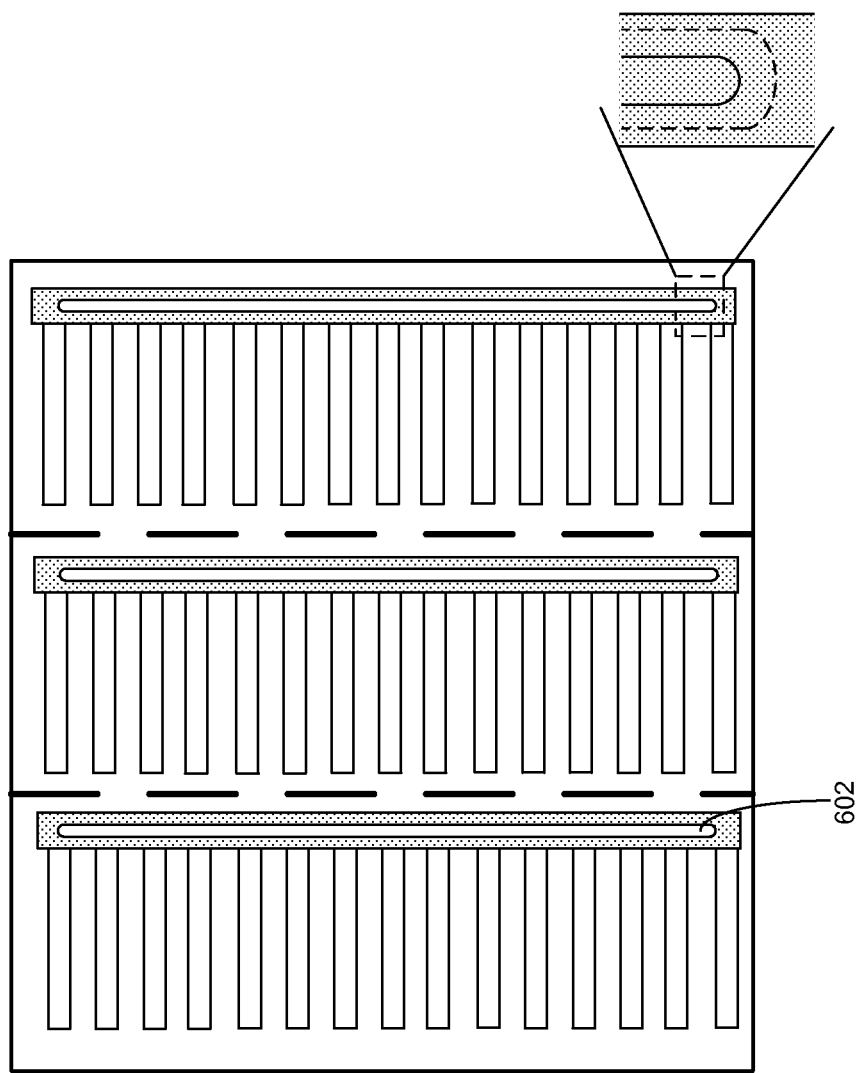
FIG. 6A shows a photovoltaic structure with conductive paste applied on the busbars, according to one embodiment of the invention.

In addition to droplets, the paste dispenser may also dispense conductive paste on top of the busbars in the form of continuous or interrupted strands. FIG. 6A shows a photovoltaic structure with conductive paste applied on the busbars, according to an embodiment of the invention. In the example shown in FIG. 6A, continuous strands of conductive paste, such as strand 602, are deposited onto the busbars of photovoltaic structure 600. Because the strands of conductive paste nearly run through the entire length of the busbars, the adhesiveness can be guaranteed. On the other hand, the amplified view at the corner shows that, after the strips are overlapped at the edge and the paste is cured, the strands can expand both in length and in width. Hence, when depositing the strands of paste, the paste dispenser needs to control the overall dispensed paste quantity to ensure that there is no paste overflow. One way to form a continuous strand of paste along the busbar is to have the paste dispenser dispense smaller droplets of paste that are immediately adjacent to each other to form a continuous line. In some embodiments, the width of the strands, such as strand 602, can be between 100 and 200 microns.

Figure 6B:
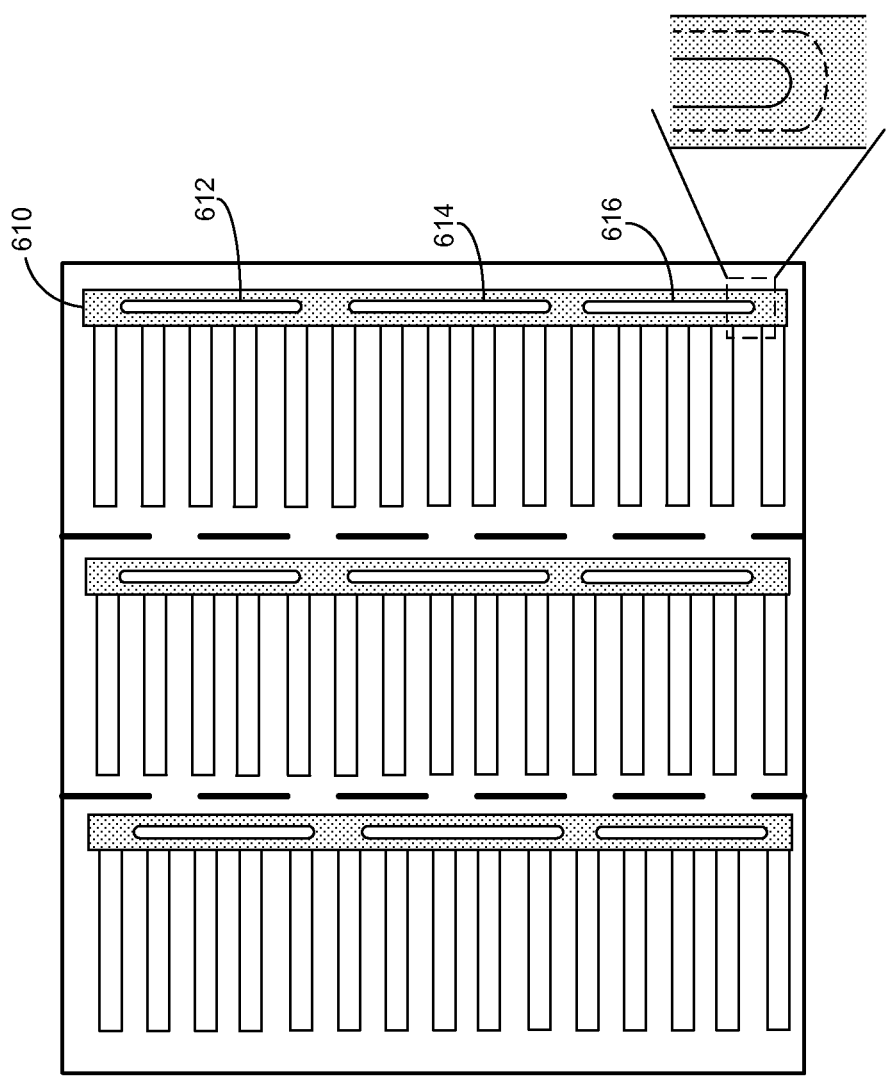
FIG. 6B shows a photovoltaic structure with conductive paste applied on the busbars, according to one embodiment of the invention.

In addition to the continuous strands, the paste dispenser may deposit a number of interrupted strands of conductive paste on top of the busbars. FIG. 6B shows a photovoltaic structure with conductive paste applied on the busbars in the form of interrupted strands, in accordance with an embodiment of the invention. In the example shown in FIG. 6B, multiple shorter strands of conductive paste are applied on each busbar. For example, shorter strands 612, 614, and 616 are formed on top of busbar 610.

Figure 6C:
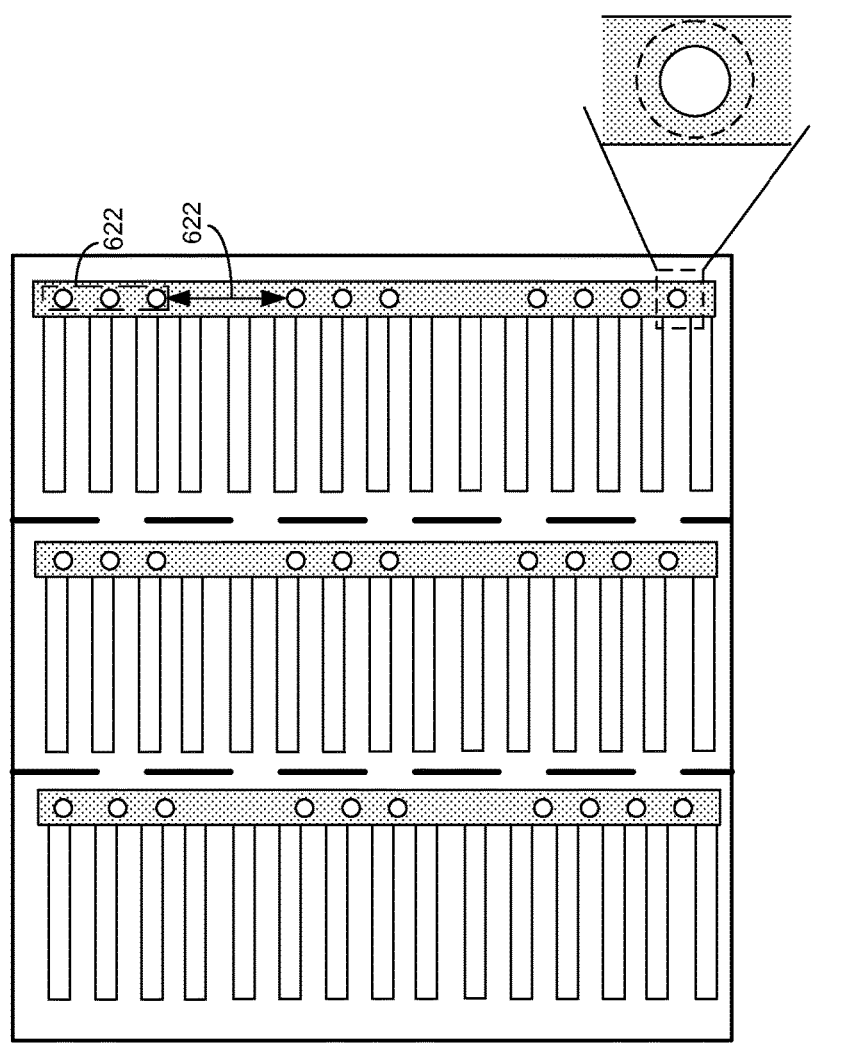
FIG. 6C shows a photovoltaic structure with conductive paste applied on the busbars, according to one embodiment of the invention.

FIG. 6C shows a photovoltaic structure with conductive paste applied on the busbars, according to an embodiment of the invention. In the example shown in FIG. 6C, additional larger spacing, such as spacing 622, can be created between the paste droplets to allow a subsequent probe-test to be performed on the busbars. Such additional spacing can be as wide as 8 mm to prevent the test probe from touching the paste droplets.

The possible formations of the conductive paste on top of the busbars should not be limited to the ones shown in FIGS. 3, 6A, 6B, and 6C. Other forms are also possible as long as the paste, after curing, can provide sufficient adhesive force and electrical conduction, and does not overflow beyond the busbars.

Figure 7:
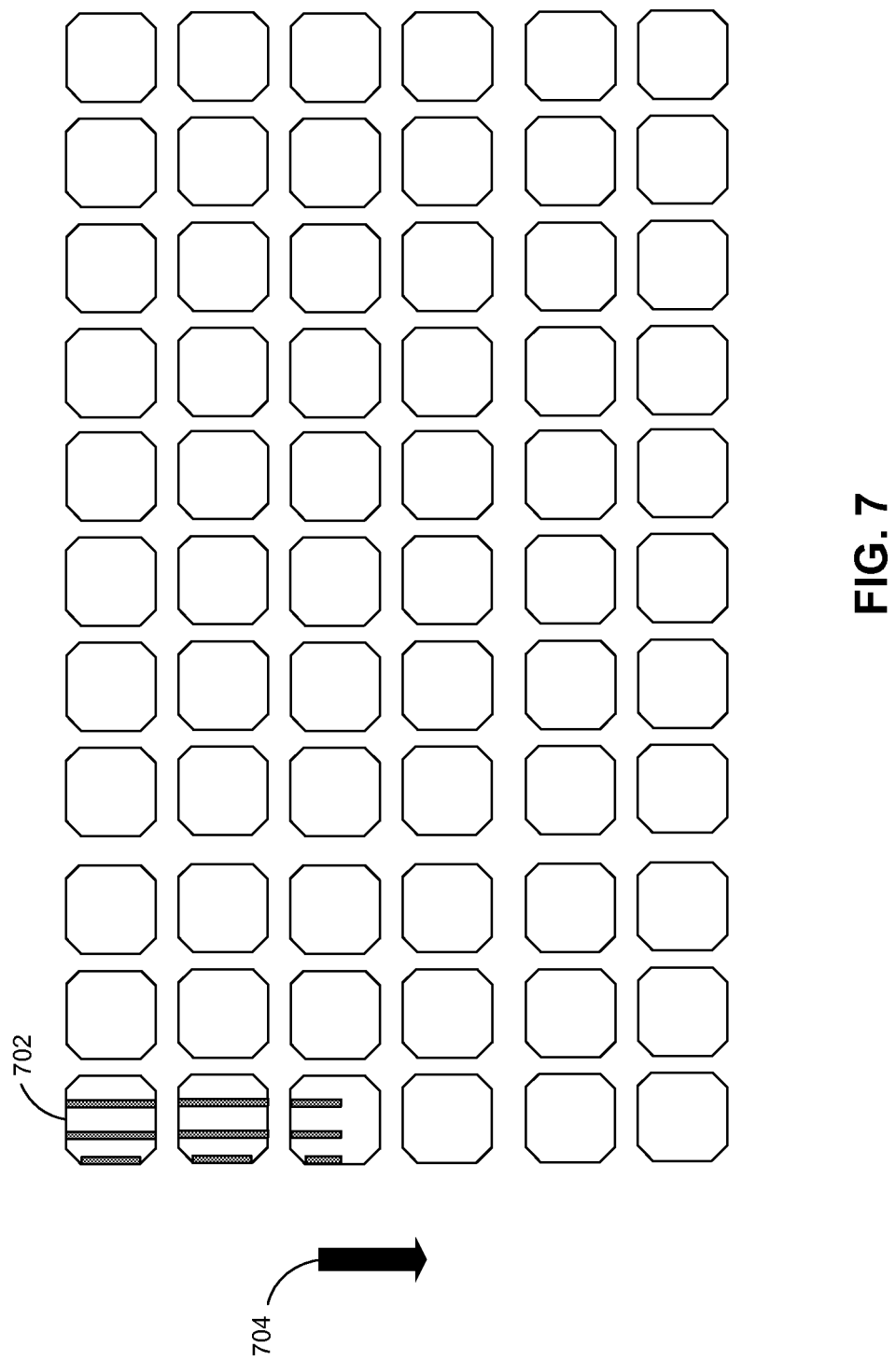
FIG. 7 shows photovoltaic structures in an exemplary panel layout formation, according to one embodiment of the invention.

FIG. 7 shows photovoltaic structures in an exemplary panel layout formation, according to an embodiment of the invention. In FIG. 7, conductive paste can be applied to a plurality of photovoltaic structures as they are carried by the conveyor to pass through the paste-dispensing system. The shaded bars on the photovoltaic structures, such as shaded bars on photovoltaic structure 702, can indicate locations where the paste can be applied. Arrow 704 indicates the paste-application direction, which can be against the moving direction of the conveyor (if the paste-dispensing system remains stationary) or same as the moving direction of the paste-dispensing system (if the conveyor remains stationary). In the example shown in FIG. 7A, the photovoltaic structures are shown in a panel layout formation. In practice, the photovoltaic structures may be assembled into a panel after they are cleaved into multiple strips and the strips are cascaded into strings.

In general, during the paste application, the conveyor can move at a constant speed, which can be a key factor in increasing the throughput and reliability of the system. The only time that the conveyer may need to pause is when the paste cartridge runs out of paste and needs to be refilled. In some embodiments, the paste cartridge can be replaced on a regular basis. For example, after applying paste to a certain number of photovoltaic structures, the conveyor can pause, and the robotic arm holding the dispensers can swing out, moving the paste dispensers away from the conveyor to allow an operator to manually exchange paste cartridges. Such a process can be a brief (e.g., within a few seconds) process, and the impact to the system throughput can be low. On the other hand, it is also possible to have a continuous supply of paste to the paste cartridge. For example, the paste cartridge may be connected, via tubes, to an external tank that holds a large amount of paste. The tank can continuously refill the paste cartridges as long as the tank, the connecting tube, and the cartridges are all under temperature control.

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:

1. A system for manufacturing a solar panel that comprises cascaded photovoltaic structures, the system comprising:
   a conveyor configured to move to-be-stacked photovoltaic structures, wherein a first surface, facing away from the conveyor, of a first photovoltaic structure includes a first busbar, wherein the conveyor has a moving direction aligned along the first busbar; and
   a paste-dispensing module configured to dispense a plurality of droplets of conductive paste in a line of droplets on top of the first busbar, wherein dispensed conductive paste is configured to facilitate bonding between the first busbar and a second busbar on a second photovoltaic structure so that when bonded a portion of the first photovoltaic structure including the first busbar overlaps a portion of the second photovoltaic structure including the second busbar with the line of droplets of conductive paste located between the first and second busbars, wherein the paste-dispensing module is configured to dispense the droplets in the line of droplets to be sized and spaced apart from adjacent droplets in the line of droplets so that after being bonded the droplets do not overlap with adjacent droplets in the line of droplets, and wherein the paste-dispensing module comprises:
      a cartridge configured to hold the conductive paste;
      a jet dispenser coupled to the cartridge, wherein the jet dispenser is configured to dispense a predetermined amount of the conductive paste for each droplet via a nozzle on the first busbar; and
      a robotic arm coupled to the jet dispenser, wherein the robotic arm is configured to adjust a position of the jet dispenser, thereby facilitating alignment between the jet dispenser and the first busbar; and
   a vision module configured to detect locations of the first busbar and output detected locations of the first busbar to a controller of the robotic arm to instruct the robotic arm to adjust the position of the jet dispenser relative to the conveyor while the first photovoltaic structure is being moved on the conveyor past the jet dispenser in order for the line of droplets to be dispensed in a straight line along a longitudinal direction of the first busbar aligned to the moving direction of the conveyor,
   wherein the robotic arm coupled to the jet dispenser has three degrees of freedom and the robotic arm is configured to be controlled with a feedback loop which measures a location of the robotic arm and sends location information to the controller of the robotic arm, and
   wherein the system includes actuators configured to move the robotic arm.

2. The system of claim 1, wherein the robotic arm is configured to adjust the position of the jet dispenser so that the line of droplets of the conductive paste propelled onto the first busbar are aligned to be centered along a longitudinal axis of the first busbar.

3. The system of claim 1, wherein a respective droplet has a volume between 10 and 20 nanoliters, and wherein a diameter of the droplets after being dispensed onto the first busbar and before being bonded to the second busbar is between 300 and 400 microns and after being bonded to the second busbar the diameter of the droplets is between 50% and 90% of a width of the first busbar.

4. The system of claim 3, wherein after being dispensed onto the first busbar and before being bonded a distance between adjacent droplets in the line is at least 2 mm.

5. The system of claim 1, wherein the robotic arm is configured to remain stationary while the jet dispenser module is dispensing the droplets of conductive paste on the first photovoltaic structure, wherein the conveyor is moving at a constant speed and wherein the spacing of the droplets is controlled based on the speed of the conveyor and controlling a droplet dispensing frequency of the jet dispenser.

6. The system of claim 5, wherein the jet dispenser comprises multiple paste outlets configured to simultaneously dispense lines of droplets of conductive paste on multiple busbars of the first photovoltaic structure.

7. The system of claim 6, wherein the robotic arm is configured to:
rotate the entire jet dispenser so that each of the multiple paste outlets is aligned to an individual busbar of the first photovoltaic structure; or independently adjust a location of each paste outlet.

8. The system of claim 2, further comprising the vision module is further configured to:
detect locations of the first busbar; and
output detected locations of the first busbar to the robotic arm to facilitate the robotic arm to adjust the position of the jet dispenser in a direction perpendicular to the moving direction of the conveyor while the first photovoltaic structure is being moved past the jet dispenser in the moving direction of the conveyor in order for the dispensed line of droplets to be centered along the longitudinal axis of the first busbar.

* * * * *